United States Patent
Jain

(10) Patent No.: US 11,888,691 B1
(45) Date of Patent: Jan. 30, 2024

(54) FOLDABLE INGRESS BUFFER FOR NETWORK APPARATUSES

(71) Applicant: Innovium, Inc., San Jose, CA (US)

(72) Inventor: Ajit Kumar Jain, Cupertino, CA (US)

(73) Assignee: Innovium, Inc., San Jose, CA (US)

( * ) Notice: Subject to any disclaimer, the term of this patent is extended or adjusted under 35 U.S.C. 154(b) by 863 days.

(21) Appl. No.: 16/933,264

(22) Filed: Jul. 20, 2020

(51) Int. Cl.
*H04B 1/64* (2006.01)
*H04L 12/10* (2006.01)
*H04L 41/0823* (2022.01)
*G11C 7/10* (2006.01)
*H04L 41/12* (2022.01)

(52) U.S. Cl.
CPC ........ *H04L 41/0823* (2013.01); *G11C 7/1006* (2013.01); *H04L 41/12* (2013.01)

(58) Field of Classification Search
CPC . H04L 41/0823; H04L 41/12; H04L 47/6255; H04L 47/125; H04L 45/16; H04L 49/9089; H04L 45/7453; H04L 49/90; H04L 67/1023; H04L 69/22; H04L 47/20; H04L 41/0661; G11C 7/1006
See application file for complete search history.

(56) References Cited

U.S. PATENT DOCUMENTS

| | | | |
|---|---|---|---|
| 7,106,860 B1 | 9/2006 | Yu et al. | |
| 7,634,622 B1 * | 12/2009 | Musoll | H04L 49/9089 711/149 |
| 2004/0130961 A1 * | 7/2004 | Kuo | G11C 7/1042 365/230.03 |
| 2004/0223516 A1 | 11/2004 | Adkisson et al. | |
| 2010/0246275 A1 * | 9/2010 | Aybay | H04L 45/00 711/147 |
| 2011/0033048 A1 * | 2/2011 | Stanwood | H04W 72/04 380/255 |
| 2015/0199272 A1 | 7/2015 | Goel et al. | |
| 2015/0262683 A1 * | 9/2015 | Youn | G11C 16/26 365/185.12 |
| 2016/0162359 A1 * | 6/2016 | Kittner | G06F 3/0619 714/764 |
| 2017/0357570 A1 * | 12/2017 | Edsö | G06F 12/023 |
| 2018/0322086 A1 | 11/2018 | Tailliet et al. | |

OTHER PUBLICATIONS

U.S. Appl. No. 16/933,268, Non-Final Office Action dated Apr. 29, 2021.
U.S. Appl. No. 16/933,268, Notice of Allowance dated Aug. 5, 2021.

* cited by examiner

*Primary Examiner* — Awet Haile
(74) *Attorney, Agent, or Firm* — Shield Intellectual Property PC; Kirk D. Wong

(57) ABSTRACT

A network device implements a foldable ingress buffer for buffering data units as they are being received. The buffer is organized into a grid of memory banks, having different columns and rows. A Transport Data Unit ("TDU") is stored interleaved across entries in multiple banks. As each portion of a TDU is received, the portion is written to a different bank of the buffer. In each column of the buffer, a full-sized TDU has portions in a number of rows equal to the number of folds in the buffer. The sum of the bank widths for each row thus needs be no larger than half the maximum TDU size, which further means that the number of columns in the grid of banks may be reduced by at least half compared to non-folded approaches, with little increase in the number of rows, if any, depending on blocking and reading requirements.

17 Claims, 10 Drawing Sheets

FOLDABLE INGRESS BUFFER FOR NETWORK APPARATUSES

CROSS-REFERENCE TO RELATED APPLICATIONS

This application is related to U.S. Patent Application Ser. No. 16/933,268, filed on the same date herewith, entitled "Packed Ingress Interface for Network Apparatuses," by Jain, et al., the entire contents of which are hereby incorporated by reference for all purposes as if fully set forth herein.

TECHNICAL FIELD

Embodiments relate generally to computer networking, and, more specifically, to techniques for automatically identifying and/or managing network traffic flows.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

A computer network is a set of computing components interconnected by communication links. Each computing component may be a separate computing device, such as, without limitation, a hub, switch, bridge, router, server, gateway, or personal computer, or a component thereof. Each computing component, or "network device," is considered to be a node within the network. A communication link is a mechanism of connecting at least two nodes such that each node may transmit data to and receive data from the other node. Such data may be transmitted in the form of signals over transmission media such as, without limitation, electrical cables, optical cables, or wireless media.

The structure and transmission of data between nodes is governed by a number of different protocols. There may be multiple layers of protocols, typically beginning with a lowest layer, such as a "physical" layer that governs the transmission and reception of raw bit streams as signals over a transmission medium. Each layer defines a data unit (the protocol data unit, or "PDU"), with multiple data units at one layer typically combining to form a single data unit in another. Additional examples of layers may include, for instance, a data link layer in which bits defined by a physical layer are combined to form a frame or cell, a network layer in which frames or cells defined by the data link layer are combined to form a packet, and a transport layer in which packets defined by the network layer are combined to form a TCP segment or UDP datagram. The Open Systems Interconnection model of communications describes these and other layers of communications. However, other models defining other ways of layering information may also be used. The Internet protocol suite, or "TCP/IP stack," is one example of a common group of protocols that may be used together over multiple layers to communicate information. However, techniques described herein may have application to other protocols outside of the TCP/IP stack.

A given node in a network may not necessarily have a link to each other node in the network, particularly in more complex networks. For example, in wired networks, each node may only have a limited number of physical ports into which cables may be plugged in to create links. Certain "terminal" nodes—often servers or end-user devices—may only have one or a handful of ports. Other nodes, such as switches, hubs, or routers, may have a great deal more ports, and typically are used to relay information between the terminal nodes. The arrangement of nodes and links in a network is said to be the topology of the network, and is typically visualized as a network graph or tree.

A given node in the network may communicate with another node in the network by sending data units along one or more different paths through the network that lead to the other node, each path including any number of intermediate nodes. The transmission of data across a computing network typically involves sending units of data, such as packets, cells, or frames, along paths through intermediary networking devices, such as switches or routers, that direct or redirect each data unit towards a corresponding destination.

While a data unit is passing through an intermediary networking device—a period of time that is conceptualized as a "visit" or "hop"—the device may perform any of a variety of actions, or processing steps, with the data unit. The exact set of actions taken will depend on a variety of characteristics of the data unit, such as metadata found in the header of the data unit, and in many cases the context or state of the network device. For example, address information specified by or otherwise associated with the data unit, such as a source address, a destination address, or path information, is typically used to determine how to handle a data unit (e.g. what actions to take with respect to the data unit). For instance, an Internet Protocol ("IP") data packet may include a destination IP address field within the header of the IP data packet, based upon which a network device may determine one or more other networking devices, among a number of possible other networking devices, to forward the IP data packet to. The logic within a network device that controls the specific set of actions performed with respect to a given data unit is often referred to as "packet-switching" or "forwarding" logic.

A network device may include any number of internal hardware and/or software components configured to handle the movement of data units between processing components within the device and, eventually, out of the device. It is desirable for these components to quickly determine where to send and/or store data for processing, and to expediently send and/or store that data to the appropriate destination once determined. Moreover, it is desirable for these components to handle network traffic in a manner that will optimally utilize available network resources throughout the network in which the device is situated.

BRIEF DESCRIPTION OF THE DRAWINGS

The present inventive subject matter is illustrated by way of example, and not by way of limitation, in the figures of the accompanying drawings and in which like reference numerals refer to similar elements and in which.

DETAILED DESCRIPTION

Figure 1:
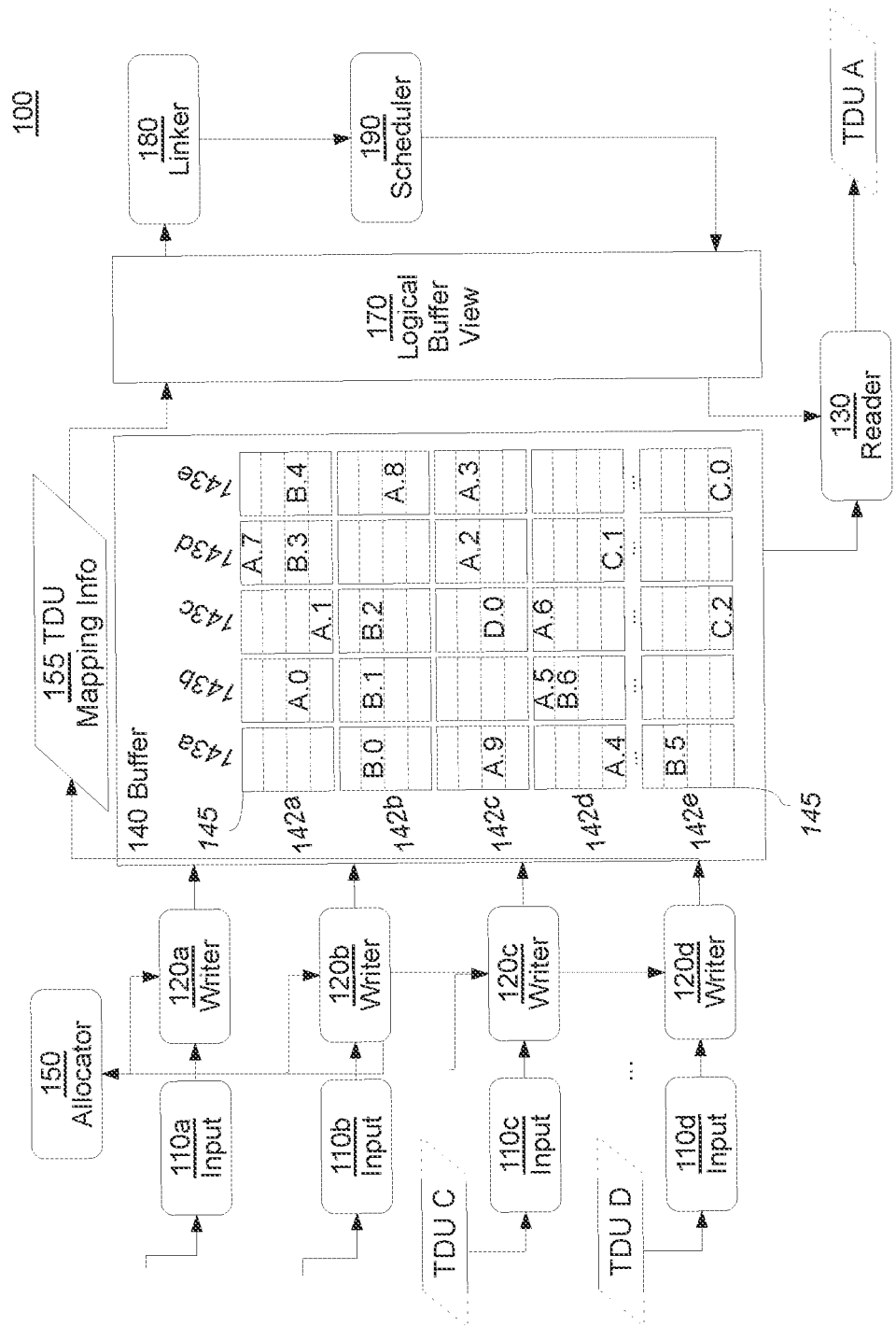
FIG. 1 is an illustrative view of various components of an example ingress buffering subsystem with folded buffers.

In the following description, for the purposes of explanation, numerous specific details are set forth in order to provide a thorough understanding of the present inventive subject matter. It will be apparent, however, that the present inventive subject matter may be practiced without these specific details. In other instances, well-known structures and devices are shown in block diagram form in order to avoid unnecessarily obscuring the present inventive subject matter.

Embodiments are described herein according to the following outline:
1.0. General Overview
2.0. Folded Buffer
  2.1. System Overview
  2.2. Functional Overview
3.0. Packed Ingress Interface
  3.1. System Overview
  3.2. Functional Overview
4.0. Example Network Device
  4.1. Networks
  4.2. Data Units
  4.3. Network Paths
  4.4. Network Device
  4.5. Ports
  4.6. Packet Processors
  4.7. Buffers
  4.8. Queues
  4.9. Traffic Management
  4.10. Forwarding Logic
  4.11. Multi-Pipeline Architecture
  4.12. Ingress Buffering Subsystem Integration
  4.13. Miscellaneous
5.0. Example Embodiments
6.0. Implementation Mechanism—Hardware Overview
7.0. Extensions and Alternatives
1.0. General Overview Approaches, techniques, and mechanisms are disclosed for improving performance of switches or other network devices by optimizing ingress buffering and/or architecture. According to some embodiments, a network device implements a foldable ingress buffer for buffering data units as they are being received. Data units referred to as Protocol Data Units ("PDUs") are received, potentially concurrently, over time via a plurality of different interfaces (e.g. network communication interfaces). As the data is received, it is collected and formed into subunits referred to as Transport Data Units ("TDU"), with each PDU being divided into one or more TDUs. The TDUs are stored in a buffer, from which they may be linked into queues and processed (e.g. by a packet processor).

The buffer is organized into a grid of memory banks, having different columns and rows. A bank has multiple entries. In any given memory access cycle, one entry may be read from or written to the bank. A TDU is stored interleaved across entries in multiple banks. The TDU is divided into one or more data unit portions, or TDU portions, with each portion being no larger than the width of a bank, which is the size of an entry inside of the bank. As each data unit portion is received, the portion is written to an entry in a different bank of the buffer.

One approach for such a buffer would divide the banks into a number of columns that is at least the same as the maximum number of TDU portions that may be received for a TDU, meaning that the sum of the bank widths for each row—or row width—is at least the same as the maximum TDU size. However, because of the way the grid is organized, each row may typically be accessed by only a single writer in a given memory access cycle, with each writer corresponding to a different input interface. There must therefore be a separate row of banks for each writer. Consequently, the number of memory banks required in this approach is at least the number of TDU portions in a TDU times the number of writers. This memory requirement is often a significant constraint upon a computing device, not only in manufacturing costs, but also in power requirements and wafer area. This is particularly true for certain types of memories, such as Static Random Access Memories ("SRAM"), which are otherwise desirable for speed and performance.

According to an embodiment, the minimum number of memory banks required may be reduced by approximately half by "folding" the buffer. A full-sized TDU has portions in two different rows of each column of the buffer. The rows may be the same or different for each column, depending on the embodiment. The sum of the bank widths for each row of the buffer thus needs be no larger than half the maximum TDU size. This means that the number of columns in the grid of banks may be reduced by half compared to non-folding approaches, with little increase in the number of rows, if any, depending on blocking and reading requirements.

In an embodiment, the buffer may be read at the same time that the writers write to the buffer each memory access cycle. Consequently, in embodiments where each row is constrained to a single entity accessing the row per memory access cycle, one or more additional rows of banks may be required for reading operations. In the non-folding approach, for instance, a single additional row might be added for reading. To achieve similar bandwidth with folding embodiments, however, multiple rows may need to be added, so that the reader may access two rows in a column each memory access cycle.

In an embodiment, due to certain constraints, it may be possible that no writer can write to a particular row in a particular memory access cycle. The techniques described herein may further require that the buffer have an additional row to account for blocking issues. However, assuming that there are a significant number of writers, the added memory costs of the additional rows for reading and blocking in the folded embodiments are more than offset by the reduction in memory costs from halving the number of columns versus the non-folding approach.

In yet other embodiments, a buffer may be folded more than twice. For instance, in an embodiment, each row's width is a fourth of the maximum TDU size. For each column of the buffer, each TDU may thus have portions in four different rows, but each row would need only a fourth of the number of columns versus the non-folding approach.

Though the possible addition of further read banks (e.g. a read bank for each level of folding) and a blocking bank would mean that the savings in memory costs lessen with each fold, the folding may nonetheless be extended to any number of folds, up to the maximum number of buffer writers (e.g. a single-columned approach).

According to some embodiments, a network device may also or instead implement a packed ingress interface. In an embodiment, two or more ports are muxed together to form a single packed ingress interface into the ingress buffer. A multiplexor selects between the different inputs each input clock cycle, in a round robin approach. For instance, if there are two inputs, the multiplexor would alternate between the two inputs every other input clock cycle. For any given input clock cycle, the writer is configured to recognize which PDU and/or TDU it is writing either based on a pattern with which the multiplexor selects between the ports, or based on a signal from the packed ingress interface indicating which port is communicating in the input clock cycle.

In an embodiment, among other advantages, the packed ingress interface avoids extra logic and wiring needed to provide a separate writer for each port. The packed interface and buffer writers operate at higher speeds and/or have more bandwidth than the ports, and are thus able to handle incoming data for all of the ports coupled to the packed ingress interface, rather than being limited to processing data from only a single port. Moreover, in buffers made up of grids of memory banks, if the number of rows of memory banks required is a function of the number of writers, using a packed ingress interface as input may reduce the amount of memory needed by reducing the number of writers, and hence the number of rows required.

According to an embodiment, a packed ingress interface may also or instead support receiving data for multiple data units (e.g. multiple TDUs or PDUs) from a single port in a single clock cycle. For instance, the interface may detect an interpacket gap and/or preamble in the portion of the data stream received from the port, between an ending part of one data unit and the starting part of the other data unit. The interface may go ahead and send the ending part of the first data unit downstream to be written to the buffer. However, the interface may hold back the starting part of the second data unit in a cache. The interface sends the starting part in a subsequent clock cycle.

In an embodiment, among other advantages, this configuration reduces the potential to waste port bandwidth at the end of data units. For instance, an alternative approach would be for the port to always have the last portion of each data unit consume the entire bandwidth of the port, regardless of how much data remains to be sent. Hence, if the bandwidth of the port were 64 bytes, but the last portion of a data unit were only 2 bytes, 62 bytes of bandwidth would be wasted. By contrast, by allowing the port to pass data from multiple data units at a time, the "wasted" bandwidth may be reduced.

In an embodiment, the foregoing approach may require on some occasions that, to catch up with the port, in some future clock cycle, the interface send more than one portion of the second data unit downstream to be written to the buffer. In an embodiment, a writer may be configured to receive and write multiple data unit portions to the buffer in a memory access cycle, when needed. For instance, in an embodiment, if multiple data unit portions are received at once, the writer may be configured to write to more than one data bank in a row in the same memory access cycle.

In an embodiment, to optimize buffer space usage and/or maintain compatibility with downstream logic, it is desirable that, as much as possible, each portion of a data unit arriving at the ingress buffer be of a fixed size. In an embodiment, for these and/or other reasons, when data for multiple data units are received from the same port in the same clock cycle, the packed ingress interface may send the ending part of the first data unit to the buffer. However, the interface may hold back the starting part of the second data unit in a cache. In an embodiment, for each subsequent portion of the data stream that carries data for the second data unit, a gear shift merges the first part of data stream portion with the cached data to form a full-sized data unit portion to send downstream. In most cases, the second part of the data stream portion replaces the cached data. However, when the end of the second data unit is detected, if any part of the second data unit remains in the data stream after the merger process, instead of caching the remainder, the remainder is sent downstream as a separate data unit portion at the same time as the merged data unit portion.

In other aspects, the inventive subject matter encompasses computer apparatuses and computer-readable media configured to carry out the foregoing techniques.

2.0. Folded Buffer 2.1. System Overview

FIG. 1 is an illustrative view of various components of an example ingress buffering subsystem 100 with folded buffers, according to an embodiment. Ingress buffering subsystem 100 may be a subsystem within a switch or other network device, as described elsewhere herein, or any other computing device. In an embodiment, the various components of system 100 described below are hardware-based logic units within one or more application-specific integrated circuits (ASICs), field programmable gate arrays (FPGAs), or other integrated circuit(s). In other embodiments, some or all of the components may be software-based logic implemented by one or more processors executing instructions stored in one or more computer-readable media.

Ingress buffering subsystem 100 is generally configured to collect data from multiple inputs, and to store discrete units of that data, referred to as TDUs, interleaved amongst multiple banks within a buffer. For example, among other uses, ingress buffering subsystem 100 may temporarily buffer data arriving from various ingress ports, network interfaces, and/or interconnects in a network device until that data is ready for processing by a packet processor, and/or to be transferred to a downstream component such as a traffic manager. In an embodiment, an ingress buffering subsystem 100 within a network device may be part of an ingress arbiter that is coupled directly to a set of network interfaces on the input side and to an multiple traffic managers via an interconnect on the output side, though ingress buffering subsystem 100 may be deployed in a wide variety of other contexts.

Buffer Memory

Ingress buffering subsystem 100 includes a buffer memory 140. Buffer memory 140 may be implemented using a plurality of distinct memories, referred to as banks 145. A bank 145 may be any suitable memory unit, such as, for example, one or more SRAM memory chips. The memory unit should generally be fast enough to support write operations at the same frequency with which writers 120 receive data from their respective inputs 110. In an embodiment, the buffer memory banks 145 comprise single-ported SRAMs, though it will be recognized that multi-ported and other types of memories may be used instead.

The banks 145 are divided into a plurality of distinct entries 146. Each entry 146 is of a fixed size, also referred to as the width of the banks 145. In an embodiment, the fixed size is at least large enough to write the maximum amount of data that an input 110 receives in a given input clock cycle. In an embodiment, only one entry from each bank is accessible per memory access cycle.

A memory access cycle is a unit of time in which a component of subsystem 100 may access the buffer memory 140. A memory access cycle is typically related to a clock cycle controlled by a clock within or external to the ingress buffering subsystem 100, such as the clock cycle that controls the sending of data by the inputs 110. The clock may or may not also be the same clock used by one or more other components of the system in which the ingress buffering subsystem 100 is implemented, depending on the embodiment. Depending on the hardware upon which subsystem 100 is implemented, there may be a one-to-one correspondence between the memory access cycle and the clock cycle, or a memory access cycle may take more than one clock cycle. In the latter case, in some embodiments, memory access may be pipelined. That is, in a given clock cycle, there may be overlapping memory access operations executing concurrently for a given bank, each in a different pipeline stage.

Banks 145 are organized into rows 142 and columns 143. Each bank 145 belongs to a different combination of a row 142 and a column 143. In an embodiment, each row 142 may be accessed by only one entity (e.g. reader 130 or writer 120) per memory access cycle, on account of wiring and/or other hardware configuration constraints.

Buffer 140 stores TDUs, such as the depicted TDU A and TDU B. The TDUs may themselves be portions of larger data units referred to as PDUs. Each full-size TDU has a fixed size, which is the maximum TDU size. However, some TDUs, such as the last TDU in a PDU (also referred to as the end-of-PDU, or EOP), may be smaller than the fixed size. In an embodiment, the maximum TDU size is the maximum amount of data that other components in the implementing device are configured to communicate and/or act upon. For instance, in certain network devices, the maximum TDU size may be the fixed cell size used by the traffic managers and/or packet processors of the device. However, in other embodiments, the maximum TDU size for buffer 140 need not necessarily have any particular significance to any other system component.

Most TDUs will have multiple discrete data unit portions within the buffer 140, and each portion will be stored in an entry 146 in a different bank 145. For instance, TDU A is composed of portions TDU A.0 through TDU A.9. In some embodiments, the banks 145 occupied by a TDU need not be contiguous. A data structure referred to as a TDU mapping 155 indicates, in order, the entries 146 and banks 145 that store data for a given TDU.

The buffer 140 is a folded buffer, in that, as stored, a TDU is considered to be folded across multiple rows 142. The number of "folds" in the buffer—or "order" of the buffer—is the minimum number of rows 142 needed to store a full-size TDU, if no more than one TDU portion is stored in each bank 145. For instance, in the depicted embodiment, that number is two. (Note that this definition of "fold" means that the non-folded buffer explained in previous sections is actually considered to have a single fold). A TDU may, in some embodiments, have data in a number of rows 142 that is greater than the number of folds. However, the total width of the TDU would be no greater than the width of a number of the rows 142 that is equal to the number of folds.

In an embodiment, in any given column, a TDU has no more portions than the number of folds. For instance, the depicted TDU A, which has been fully written and is ready for reading, has exactly two portions in each column, because the number of depicted folds is two. However, a TDU that is currently being written, such as TDU B, or a TDU that is smaller than the maximum TDU size, such as TDU C, may have fewer portions than the number of folds in some or all of rows 143.

The number of columns 143 required in a buffer 140 is equal to the number of portions in a full-sized TDU, divided by the number of folds in buffer 140. This means that the size of each row 142 in such a buffer 140 may be at least half the size needed in non-folded buffers, or even smaller, depending on the number of folds. However, in other embodiments, a greater number of columns 143 than the minimum required may be used.

Inputs

Ingress buffering subsystem 100 buffers data received via multiple input components, referred to as inputs 110. Inputs 110 may convey data from any suitable source, such as network interfaces, transceivers, Serializer/Deserializer ("SerDes") blocks, interconnects, or other upstream components. In an embodiment, each input 110 may be a packed ingress interface such as described in subsequent sections, though ingress buffering subsystem 100 may be used without packed ingress interfaces as well.

In an embodiment, in a given clock cycle, an input 110 may transmit up to a fixed portion size of a data unit, also referred to as a word, from a corresponding line. The word may be any suitable size, depending on the hardware used (e.g. sixteen bytes, sixty-four bytes, etc.). In an embodiment, the fixed portion size is equal to or less than the width of each bank 145 in the buffer 140. In some embodiments, the data unit portion received from an input 110 is always of the fixed portion size, even if padded with empty or insignificant data. In other embodiments, less data may be received in certain input clock cycles.

For illustrative purposes, input 110c is depicted being in the process of receiving data for a TDU C, while input 110d is depicted as being in the process of receiving data for a TDU D. because these TDUs are in the process of being received, there are already portions of each TDU found in the buffer 140. Additional portions of these TDUs will be received over a number of upcoming memory access cycles. Moreover, while inputs 110a and 110b are depicted as not receiving any data, they may have received portions of other TDUs, such as TDU A and TDU B, during previous memory access cycles, and may likewise begin receiving portions of other TDUs in upcoming memory access cycles.

Although four inputs 110 are depicted, there may in fact be any number of inputs 110 to the ingress buffering subsystem 110.

Writers

Ingress buffering subsystem 100 further includes writers 120 coupled to the inputs 110, and configured to write the data unit portions transmitted by the inputs 110. There is a writer 120 for each input 110. In some embodiments, the data received by an input 110 in a given input clock cycle is immediately conveyed without modification to a corresponding writer 120, while in other embodiments there may be some caching and grouping of data.

Writers 120 are configured to write the data unit portions they receive from their respective inputs 110 each input clock cycle to the buffer memory 140. Each data unit portion is written to a different entry 146 in a different bank 145. In embodiments that permit each row 142 to only be accessed by one entity per memory access cycle, to ensure that all writers 120 can write the information they receive, the buffer memory 140 has at least one row 142 per writer 120.

In an embodiment, writers 120 are configured to recognize the start (or end) of a Protocol Data Unit ("PDU") in the data they receive from their respective inputs 110. For example, the writers may be told in advance where to expect such a boundary to occur via a length field in a data unit header. Or, as another example, the writers 120 may be configured to search for a gap, preamble flag, pattern, or other signal that indicates the boundary between one PDU and another. In another embodiment, PDU boundary detection and identification is performed by the inputs 110, which convey this information to the writers 120 via a sideband.

In any case, whenever data for a new PDU begins, the writer 120 starts a TDU counter for a new TDU. Each time the writer 120 writes a new data unit portion belonging to the PDU, it increments the TDU counter. Once the TDU counter reaches the maximum TDU size, the writer 120 signals to an upstream linker 180 that a new TDU is ready for the PDU, and resets the TDU counter for a new TDU. Once the end of the PDU is detected, the writer 120 signals that another TDU (and the PDU) is complete, regardless of whether the counter has reached the maximum TDU size, and resets the TDU counter for the next PDU.

Upon writing each TDU portion, the writer 120 further updates, or causes updating of, a TDU mapping 155 for the TDU, indicating a list of entries 146 in which the data for the TDU may be found. The writer 120 may convey this TDU mapping 155 to the linker 180, or the linker 180 may generate and maintain the mapping 155 based on information from the writer 120.

A writer 120 may use various logic to decide where to write a given TDU portion. This determination may include both the specific bank 145 to write to (including the row 142 and column 143) as well as the specific entry 146 in the bank 145.

To determine the column 143, the writer 120 may in some embodiments follow some pattern. This pattern may be a function of the TDU counter for the TDU being written, and designed to ensure that, for a full-sized TDU, each column 143 will be selected no more times than the number of folds in the buffer 140. In some embodiments, the pattern is such that, as the TDU is being written, the maximum difference in the number of portions of the TDU that can be found in any given column 143 is one. In other embodiments, no such constraint is necessary.

The pattern may simply be, for instance, that when the TDU counter is at 0, the next TDU portion should be written to the first column 143, when the TDU counter is at 1, the next TDU portion should be written to the second column 143 and so forth, looping back to the first column 143 when the TDU counter equals the number of columns 143 in the buffer. In an embodiment, to balance column utilization, different writers 120 may begin at different columns 143, or the index of the starting column for a given TDU may be selected randomly, with the remaining columns 143 selected in accordance to the formula (starting column+TDU counter) modulo (number of columns 143). Of course, more complicated patterns may be utilized.

In yet other embodiments, the column 143 may be selected using other mechanisms, such as a prioritization algorithm that takes into account factors such as bank utilization levels, which columns 143 have previously been written to for the current TDU, which banks other writers 120 and/or the reader 130 are accessing (or are expected to access) in upcoming cycles, and so forth.

To avoid conflicts with other writers 120 and potentially a reader 130, the writers 120 and/or reader 130 may coordinate row selection via an allocation mechanism, referred to as allocator 150. The allocation mechanism may be as simple as a round-robin selection mechanism. That is, a row 142 would first be selected for writer 120a, followed by writer 120b, and so forth. Any writer 120 that does not to write in the memory access cycle would be skipped.

In an embodiment, the selection may be coordinated based on row constraints. If a writer 120 will be writing to a certain column 143 that the writer has already written to for the TDU, the row(s) to which the writer 120 previously wrote are considered "blocked" for that writer 120. A row is selected for each writer 120 in such a manner that no writer 120 is assigned to a row 142 that is blocked for that writer 120. As previously mentioned, this may require an additional row 142 in the buffer 140 for each fold, beyond the number of writers 120 and additional reading row(s), so that in a worst case scenario where all writers 120 are blocked at the maximum number of rows 142, and the blocked rows 142 are the same for each writer 120, a row may still be found for each writer 120.

In an embodiment, the allocator 150 may otherwise select a row 142 for a writer based on a variety of factors. For instance, if only a few writers 120 are writing in a given memory access cycle, it may be beneficial to determine how full each row 142 is, and then select the least-filled rows 142 for those writers 120. Or, where quotas or performance guarantees are a concern, it may be desirable to prioritize certain rows 142 for traffic associated with a particular source or destination, and to select from only those rows 142 when writing that data. In an embodiment, the allocator 150 may optionally be configured to assign rows 142 in such a manner as to prefer writing a TDU sequentially in a row 142, when possible. For instance, the allocator 150 may be configured to prioritize assigning a writer 120 to the same row 142 the writer 120 last wrote to, if that row 142 is not blocked or needed to avoid blocking rows of another writer 120.

In an embodiment, the allocator 150 may select specific banks for each writer 120. The allocator 150 may have access to the TDU mappings 155, and thus be able to determine an optimal arrangement of bank selections to allow for each TDU portion to be written to an appropriate entry 146 based of the folding scheme. Such optimization may further take into account individual fill levels for each bank 145, optimizations for upcoming read schedules or patterns, and so forth.

Once a bank 145 (that is, a specific column 143 and row 142) has been selected for a writer 142, the writer 120 may select a specific entry 146 from a list of available entries (e.g. a "free list") in the selected bank 145. Entries 146 are removed from the free list when written to, and returned to the free list when read.

If no entry 146 is available, in an embodiment, the TDU portion is dropped. In another embodiment, the writer 120 may first attempt to write the data unit portion to another bank 145 before dropping it. Other entries 146 storing TDU portions for the same PDU may be freed, and the writer 120 stores data indicating that subsequent portions of the PDU are to be dropped without being written.

Reader

Ingress buffering subsystem 100 further includes a reader 130. The reader 130 reads data from the buffer memory 140 and outputs that data to one or more downstream components, such as to a packet processor, traffic manager, interconnect, etc. The reader 130 may output portions individually, or combine the portions into their respective TDUs prior to sending them downstream. For instance, reader 130 is depicted as being in the process of reading and outputting portions of TDU A.

The reader 130 may be configured to read from different numbers of banks 145 per memory access cycle, depending on the embodiment. In an embodiment, reader 130 performs read operations in response to read instructions from other components, such as scheduler 190.

In some embodiments, the reader 130 is configured to read concurrently with writers 130 writing to the buffer memory 140. The buffer memory 140 may thus include additional rows 142 to support concurrent access. For instance, in an embodiment, the reader 130 is configured to read at least two banks 145 per memory access cycle, each from a different row 142. Consequently, when the embodiment permits only one access per row 142 each memory access cycle, the buffer memory 140 has at least one row 142 per writer 120 plus two banks 145 for the reader 130. In yet other embodiments, the reader 130 may be configured to read other numbers of rows 142 each memory access cycle, such as the number of folds in the buffer memory 140. The buffer memory 140 might therefore include an additional row 142 for each additional fold.

In an embodiment, the allocator 150 may further be responsible for ensuring that read operations do not conflict with write operations. The reader 130 indicates to allocator 150 specifically which row(s) 142 the reader 130 will read. The allocator 150 always gives the reader 130 priority, and ensures that the writers 120 will not access these row(s). In yet other embodiments, the reader 130 may not necessarily always have priority over the writers 120, and the allocator 150 may indicate to the reader 130 which rows 142 the reader 130 may actually read.

In yet other embodiments, the reader 130 might instead be given exclusive access to the buffer memory 140 in certain memory access cycles (e.g. alternating cycles, every fourth cycle, etc.).

Linker/Scheduler

According to an embodiment, the ingress buffering subsystem 100 utilizes a queueing mechanism to control the reading and delivery of TDUs from the buffer 140 to a downstream component (undepicted). Although this queueing may be facilitated in a variety of manners, in an embodiment, the queueing is facilitated by a linker 180 and scheduler 190.

Generally, linker 180 adds TDUs to one or more queues once the TDUs have been buffered. In a simple embodiment, for example, there may be a single first-in-first-out (FIFO) queue to which all TDUs are added, in the order of receipt. On the other hand, in other embodiments, there may be any number of queues, and different queues may have different purposes. For instance, there may be different queues for different sources, destinations, traffic flows, types of PDUs, and so forth.

Based on these queues, scheduler 190 instructs the reader 130 to read TDUs, portion by portion. For example, the scheduler 190 may determine at various intervals that a downstream component is ready to receive data. The scheduler 190 may select a queue to process, and dequeue the TDU at the head of that queue. Based on the TDU mapping 155 for the TDU, the scheduler 190 may generate a schedule of read instructions to be performed in upcoming memory access cycles. The portions may be read in sequence, or non-sequentially. In the latter case, the results may be cached and reorganized in the proper order before sending the TDU downstream.

The scheduler 190 may further schedule multiple TDUs for reading concurrently in the same memory access cycle, in alternating memory access cycles, or in accordance to any other schedule that may more optimally read the TDUs.

In an embodiment, the queues are organized based on PDUs. For example, linker 180 may wait for a signal from a writer 120 that a PDU has been received and buffered. Upon receiving such a signal, the linker 180 may add information identifying the PDU to an inter-packet linking memory that describes a queue, typically at the tail of the queue. In such an embodiment, the linker 180 may further be involved in generating other linking information by which each TDU of the PDU may be read when needed. Such information may include, for instance, intra-packet linking data that includes an identifier for each TDU in the PDU, and the TDU mapping information 155 that indicates the entries 146 in which each portion of a TDU is found.

When it is time to send additional data downstream, the scheduler 190 may select a queue to process, select the PDU at the head of that queue, and identify the first TDU in the PDU. Based on TDU mapping information 155 for that TDU, the scheduler 190 may generate a schedule of read instructions for the reader 130 to be perform in the upcoming memory access cycles to read the TDU. The scheduler 190 may continue to do this for other TDUs of the PDU until the entire PDU may be read.

In an embodiment, the linker 180 may instead simply request that the reader 130 read a TDU, and the reader 130 will then translate that request into individual read instructions for each bank 145 that stores data for the TDU, as indicated by the TDU mapping information 155.

In an embodiment, for purposes of simplicity and/or compatibility, linker 180 and/or scheduler 190 may be unaware of the fact that the buffer 140 is folded, and instead be presented with a non-folded logical view 170 of the buffer 140, in which each TDU consumes no more than a single row. The reader 130 or some other component of ingress buffering subsystem 170 may be responsible for translating between the actual physical organization of the buffer 140 and the logical view 170, both for the purposes of communicating the contents of the buffer 140 to the linker 180 and/or scheduler 190, as well as translating a read request back into the actual buffer layout.

In an embodiment, there may be more than one reader 130, and allocator 150 may be configured to arbitrate between the readers to avoid read access conflicts.

Miscellaneous

Subsystem 100 is merely an example of a buffering subsystem in which the described techniques may be practiced. Other implementations may include fewer and/or additional components in varying arrangements, and the distribution of work between components may likewise vary. For example, the linker 180 and scheduler 190 may be optional, and read instructions may be generated by any other suitable component. Meanwhile, logical view 170 is optional, depending on the embodiment. Moreover, the sizes of the buffer 140 and banks 145, as well as the number of rows 142, columns 143, writers 120, inputs 110, and/or folds will vary depending on the embodiment.

According to an embodiment, a TDU may instead be any type of data unit, and need not be a portion of a larger unit like a PDU. For instance, the output of ingress buffering subsystem may simply be a stride or word of an appropriate size to be utilized by a downstream component. Similarly, in an embodiment, a PDU may be any kind of data unit instead of a PDU.

2.2. Functional Overview

This section describes example process flows for writing to and reading from a folded buffer, such as described with respect to ingress buffering subsystem 100 above. The flows may be performed within the switches and network devices described in other sections and/or in other computing devices. In an embodiment, each flow may be performed by ingress buffering subsystem 100, though the flows may similarly be performed in other buffering subsystems, and ingress buffering subsystem 100 need not be limited specifically to performance of the example flows described below.

In an embodiment, each of the processes described in connection with the functional blocks described below may be implemented using one or more integrated circuits, logic components, computer programs, other software elements, and/or digital logic in any of a general-purpose computer or a special-purpose computer, while performing data retrieval, transformation, and storage operations that involve interacting with and transforming the physical state of memory of the computer.

Write Flow

Figure 2:
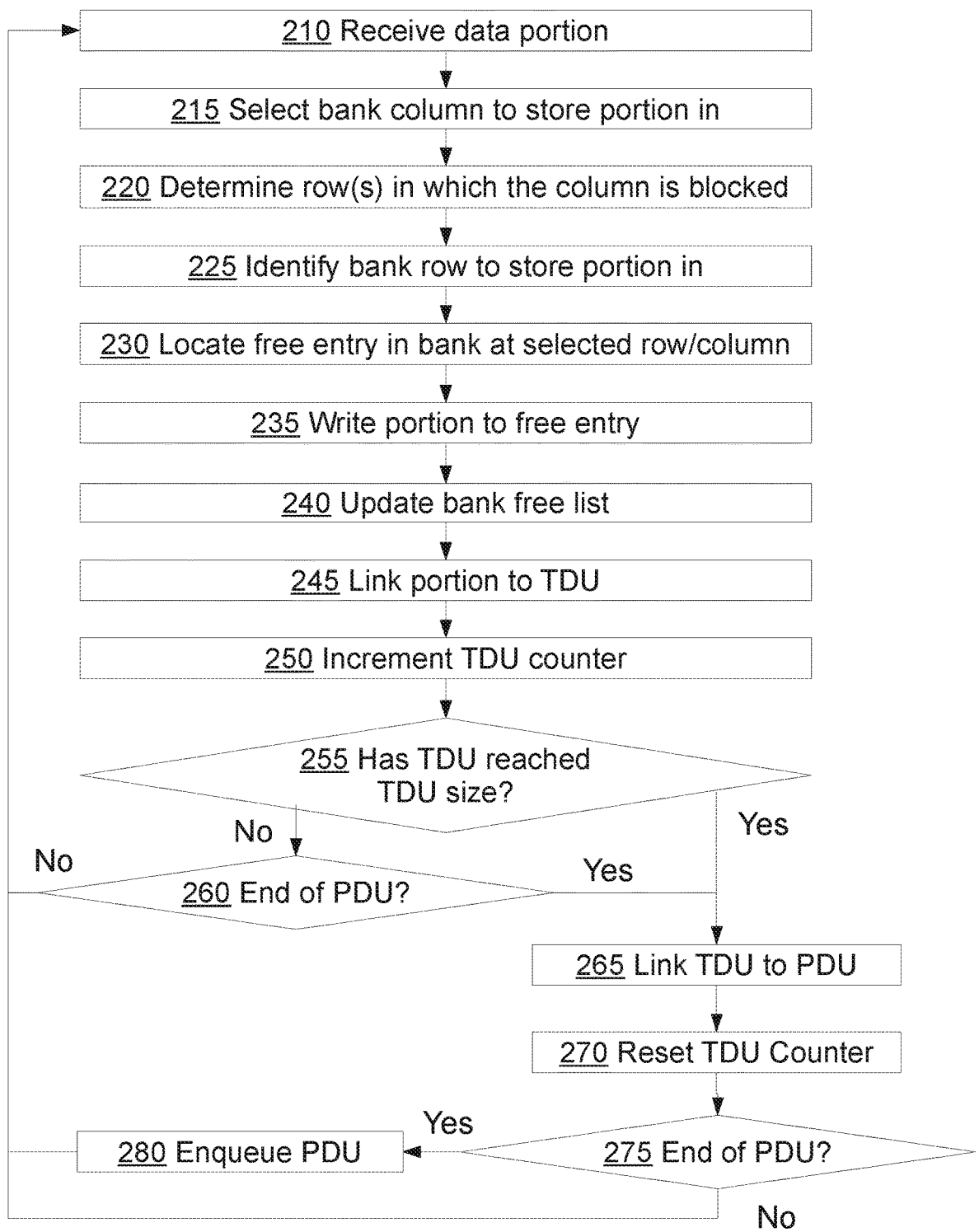
FIG. 2 illustrates a flow for buffering a Transport Data Unit ("TDU")

FIG. 2 illustrates a flow 200 for buffering a TDU, according to an embodiment. Flow 200 is described from the perspective of a single input, such as input 110, but is performed concurrently for each input of the ingress buffering subsystem. Over the course of an input receiving a large quantity of data, such as one or more PDUs, flow 200 is repeated many times. In some embodiments, flow 200 is pipelined, in that each iteration of flow 200 with respect to a particular input may partially overlap with one or more preceding or subsequent iterations—for instance, as soon as block 210 concludes for a first iteration, a second iteration of flow 200 may begin while the first iteration is still ongoing.

Block 210 comprises receiving a data unit portion from the input. The data unit portion is the amount of data delivered by the input to an associated writer over a specific period of time, such as an input clock cycle. In some embodiments, each data unit portion may be a fixed number of bits or bytes, such as a word or other structure. In other embodiments, while the data unit portion will most commonly be a word, the data unit portion may be of a different size, particularly if the data unit portion is the last portion of a PDU. The received data is a portion of a TDU.

Block 215 comprises selecting which column, in a grid of memory banks such as buffer 140, to store the portion in. The column may be selected in any suitable manner. For instance, the column for a given input may simply change each time flow 200 is performed in accordance to a pattern. A simple pattern might be used, such as a round-robin selection of columns beginning at the first column and looping back to the first column once the last column is reached. Or, more complex patterns may be used. For instance, different inputs may have patterns that begin at different columns, proceed in reverse order, follow non-sequential orders, and so forth.

In an embodiment, the column is selected based on a function of a TDU counter, which indicates the size of the TDU that is currently being received. The TDU counter may, for instance, be set to zero whenever receipt of a new TDU begins, and be incremented any time a new data unit portion is received and/or written for the TDU. The function may be simple—for instance, the selected column number may be the remainder when the TDU counter is divided by the number of columns. In an embodiment, the TDU counter may be adjusted by a fixed offset for the input. In an embodiment, more complex formulas may be used, or the TDU counter may be used as an index into an array of column numbers arranged in accordance to a pattern such as described above.

In some embodiments, there may be multiple TDUs and/or PDUs for which an input is conveying data unit portions concurrently, and block 215 may therefore involve identifying the PDU or TDU to which the data unit portion received in block 210 belongs. For instance, the input may provide, in addition to the data unit portion itself, a port identifier or PDU identifier associated with the data unit portion. The identifier may be used to locate the relevant TDU counter for the data unit portion. If no TDU counter exists, a new TDU counter may be instantiated.

In yet other embodiments, the column is selected according to logic that takes into consideration elements such as what columns have already been selected for a TDU, fill levels for columns, storage needs for TDUs being received by other inputs, a random number generator, and/or any other suitable factor.

In any case, the pattern, function, or logic is such so as to ensure that, over any period of time, all columns will be selected once before any column is selected again. In another embodiment, the pattern, function, or logic is such as to ensure that, for any given TDU, no column is selected more times than the number of folds in buffer.

For instance, referring back to FIG. 1, if TDU A were being written, the pattern might be column index=(TDU counter+1) modulo (number of columns). So the second column (143*b*) is selected for the first portion (A.0), the third column (143*c*) for the second portion (A.1), the fourth column (143*d*) for the third portion (A.2), the fifth column (143*e*) for the fourth portion (A.3), the first column (143*a*) for the fifth portion (A.4), the second column (143*b*) again for the sixth portion (A.5), and so on.

Block 220 comprises determining which row or rows in the grid are blocked for the selected column, if any. A row is considered to be blocked if the bank at the selected column in the row already has a portion of the TDU stored therein. This determination may comprise, for instance, looking at TDU mapping information that indicates which banks already store data for the TDU. Depending on how much of the TDU has been received, there may be any number of blocked rows, up to one less than the number of folds in the buffer. If this is the first time the column has been selected for the TDU, no rows will be blocked.

For instance, for TDU A.5, column 143*b* would have been selected in block 215. Since TDU A already has a portion (A.0) that occupies row 142*a*, row 142*a* would be blocked for A.5.

Block 225 comprises identifying the row of the grid in which to store the portion. In an embodiment, block 225 comprises sending the list of blocked row(s), if any, to an allocator, waiting for the allocator to select a row for the input, and receiving the row number back from the allocator. The allocator compiles a master list of blocked row(s) for each input of the ingress buffering subsystem and, based thereon, assigns rows to the inputs. Inputs that did not convey data unit portions in their respective iterations of block 210 do not need to be assigned a row. In some embodiments, the allocator may also receive an indication of one or more rows that will be read at the same time, and block selection of these rows for all writers.

The allocator may select rows in any manner that avoids assigning an input to a row that is blocked for the input or being accessed by another entity. In some embodiments, row assignments are otherwise at random. In other embodiments, rows may be selected based on factors such as fill levels of the rows and/or specific banks within the row, so that the least-filled banks are more likely to be written to when possible, or on attributes of the PDU associated with the data unit portion, so that certain rows of the buffer are preferred for certain types of flows or traffic. In an embodiment, the last row selected for a given input is selected again if possible, so that consecutive portions of a TDU are written to the same row when possible.

The allocator may be centralized logic configured to assign rows for each data unit portion that needs to be written in a given memory access cycle. Or, the allocator may be decentralized logic present in the write logic for each input, that coordinates row selection with each other writer in accordance to a predefined protocol. In the latter case, for instance, the writers may use the protocol to determine priority for writing (e.g. based on current TDU counters or blocking constraints), and then take turns selecting rows based on that prioritization.

As a result of blocks 215-225, a coordinate (row and column) of the buffer grid will have been selected for the data unit portion received in block 210, and the memory bank at this coordinate is thereby selected to store the data unit portion.

Block 230 comprises locating a free entry in the selected bank at which the data unit portion may be written. There may, for instance, be a free list for the bank, indicating which entries are currently free to store newly received data unit portions. The free entry may be selected from this list in any manner.

Block 235 comprises writing the data unit portion to this free entry. In an embodiment, if the data unit portion is smaller than the entry, the data unit portion may be padded with null, empty, or other insignificant data so as to fill the entire entry.

Block 240 comprises updating the free list to indicate that the entry written to in block 235 is no longer available for writing, thereby preventing the data unit portion from being overwritten until it has been read.

Block 245 comprises linking the data unit portion to the TDU by, for instance, writing TDU mapping data that indicates, in order, each entry in each bank that stores data for the TDU. The writer may add the address of the data unit portion to an array, linked list, or other data structure for the TDU. If this is the first data unit portion of the TDU, the writer may begin a new data structure for the TDU. Alternatively, the TDU mapping data may be generated and maintained by a linker, to which the writer sends the address of the entry to which the data unit portion was written along with an indication of the TDU and/or PDU to which the data unit portion belongs.

Block 250 comprises incrementing a TDU counter for the TDU. The counter may be incremented by one, so as to count the number of TDU portions that have been written for the TDU, or incremented by an actual amount of data that was written, so as to indicate a total size of the TDU.

Block 255 comprises determining whether the TDU has reached its maximum size. This generally involves comparing the TDU counter to a maximum TDU size threshold. For instance, in an embodiment, a TDU may comprise no more than ten portions. If the TDU counter is equal to ten, then the TDU has reached its maximum size.

If the TDU has reached its maximum size, then flow 200 proceeds to block 265. Otherwise, flow 200 proceeds to block 260, which comprises determining whether the end of the TDU or PDU has otherwise been reached. This may be determined, for instance, based on a gap, flag, character sequence, or other signal that indicates the start or end of a PDU or TDU. This signal may be in the data unit portion itself, or may be in metadata from the input that is associated with the data unit portion. Or, the boundary location may have been specified in previous data unit portions that included a data unit header with a PDU or TDU length field, and the implementing component may include a mechanism to remember when to expect the end of the TDU or PDU.

Note that, depending on the embodiment, the recognition of the end of the TDU/PDU might actually occur in the course of performing the next iteration of flow 200. For instance, the end of a PDU or TDU may be signaled by a gap, flag, character sequence, or other signal. This signal might not be received until the input clock cycle after the data unit portion being processed (i.e. the next iteration of block 210 for the input). Of course, given that writing the data unit portion may take a number of clock cycles, the writer may still know that this was the last portion of the PDU by the time the current iteration of flow 200 reaches block 260. In this case, upon recognizing the end of the PDU in response to the next input clock cycle, the writer may have stored data indicating that the end of the TDU or PDU had been reached in, for instance, the TDU mapping, based upon which the determination of block 260 may be made.

If the end of the PDU or TDU has otherwise been reached, flow 200 again proceeds to block 265. Otherwise, flow 200 returns to block 210 for receipt of a new data unit portion.

Block 265 comprises linking the TDU to the PDU. For instance, block 265 may comprise sending information identifying the current TDU and PDU to a linker so that the linker may add the information to a list of TDUs that are in the PDU.

Block 270 comprises resetting the TDU counter, so that it may be used for a new TDU. Thus, the next data unit portion to be received would start a new TDU.

At block 275, flow 200 branches depending on whether the data unit portion was the end of a PDU. If not, then flow 200 returns to block 210 for receipt of a new data unit portion in a new iteration of the flow. Otherwise, flow 200 proceeds to block 280, which comprises enqueueing the PDU for processing. This may comprise, for instance, adding information identifying the PDU to one or more processing queues. The queues to which the PDU are added may be selected in a variety of manners, including without limitation, based on sources, destinations, ports, flows, or other constructs associated with the PDU. Flow 200 then returns to block 210 for a new iteration of the flow.

Flow 200 illustrates but one example method flow for buffering data in a folded buffer. Other flows may include fewer, additional, and/or different steps in varying arrangements. For instance, in an embodiment, the counter updating and TDU boundary determination steps of blocks 250, 255, and 265 may be performed before or concurrently with blocks 215-245. As another example, instead of selecting a bank by separately determining a column and then a row in blocks 215-225, the bank selection may be a single determination based on a variety of factors. The writer may make this determination itself, and coordinate with other writers to avoid conflicts, or a central allocator may intelligently select both the row and column of the bank in an optimized manner.

In an embodiment, a PDU counter is used as the TDU counter. A new TDU is formed any time the PDU counter reaches a certain interval. For instance, if each TDU is ten portions long, then a new TDU would be formed any time the PDU counter is divisible by ten. In yet another embodiment, TDUs are the largest data unit, and not part of PDUs.

In such embodiments, TDUs would be enqueued for processing directly, rather than PDUs, and block 265 would not be necessary.

In an embodiment, a TDU bitmap may be used as a TDU counter, with a bit for each bank. A bank's bit is set to one when a portion of the TDU is stored in the bank, or zero otherwise. The number of non-zero bits in the bitmap may be the number of TDU portions stored in the buffer. The bitmap may then also be used for quickly identifying the banks that already store data for the TDU, rather than having to analyze more detailed TDU mapping information. In yet another embodiment, rather than maintaining a separate TDU counter, the contents of a TDU mapping may be analyzed to determine the current number of portions stored for a TDU whenever a count of TDU portions is needed.

Read Flow

Figure 3:
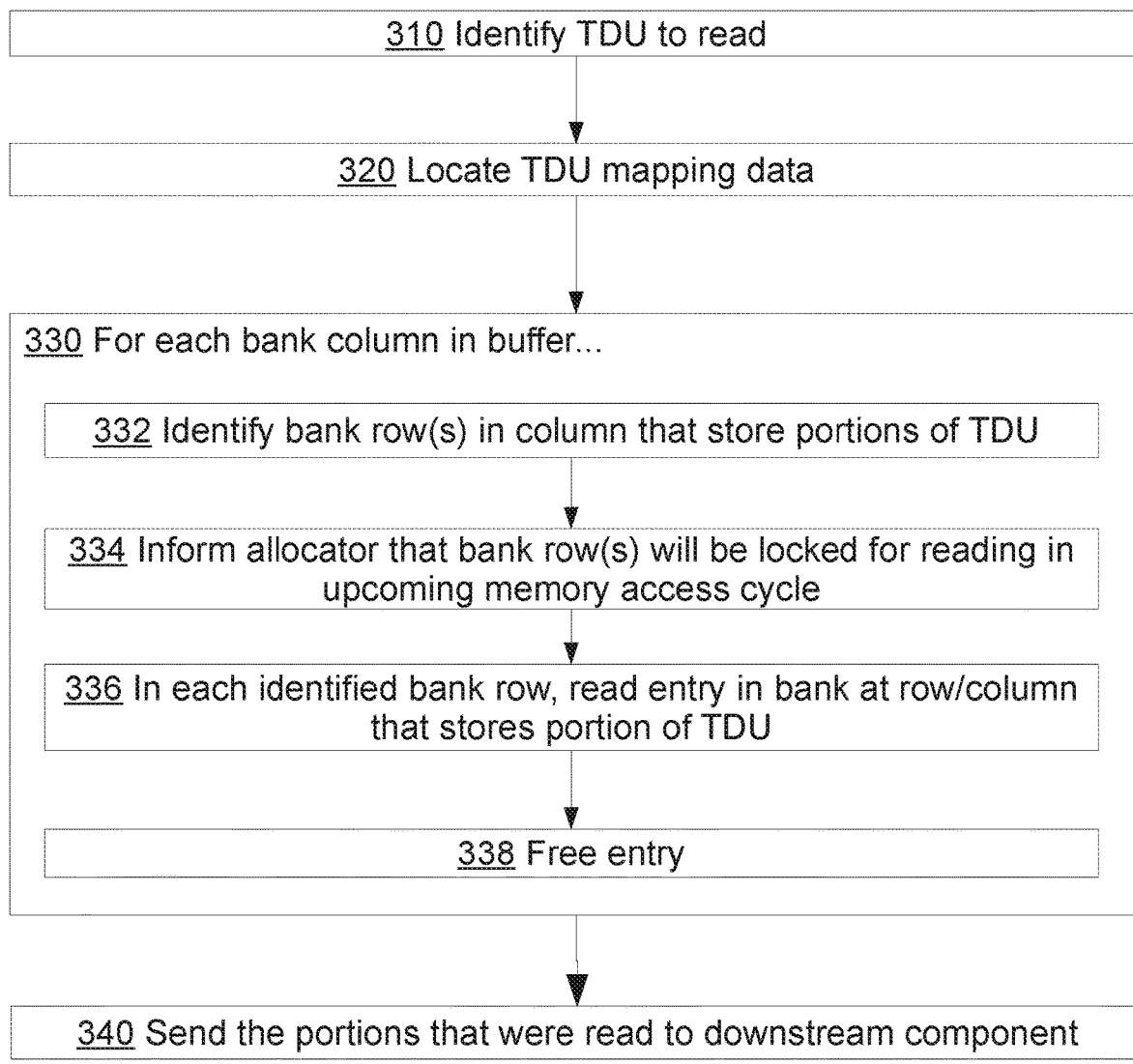
FIG. 3 illustrates a flow for reading a TDU from a folded buffer.

FIG. 3 illustrates a flow 300 for reading a TDU from a folded buffer, according to an embodiment. Among other applications, flow 300 may be performed to read TDUs written by various inputs over the course of a number of iterations of flow 200.

Block 310 comprises identifying a TDU to read. The TDU may be determined, for instance, based on a queue of TDUs or PDUs. For example, in the former case, the queue may be a simple FIFO queue, in which the next TDU to read may be the TDU identified at the head of the queue. As another example, if the queue is of PDUs, the TDU may be the next unread TDU in the PDU at the head of the queue, as indicated by TDU linking data. Or, the next TDU to read may be identified in any other suitable manner, depending on the embodiment.

In an embodiment, block 310 is performed any time a scheduler determines that read bandwidth is available to a reader in an upcoming memory access cycle. In making this determination, the scheduler may further consider other upcoming memory accesses that have already been scheduled, such as read operations that already have been scheduled for other TDUs. In an embodiment, block 310 may be performed at the request of another component, such as a downstream component configured to consume the TDUs that will be read. In an embodiment, block 310 may instead be performed at regular intervals, if possible. For instance, every certain number of clock cycles, a reader may check if a TDU is ready for reading, and if possible, begin reading the TDU.

Block 320 comprises locating TDU mapping information for the TDU, such as may have been written in the course of flow 200. The TDU mapping information indicates the entries in which the data unit portions of the TDU are found.

Block 330 comprises reading each portion of the TDU. Block 330 involves subblocks 332-338, which are performed for each column of the buffer grid in which at least one portion of the TDU is stored. In an embodiment, the first column for which block 330 is performed is the column in which the first portion of the TDU is stored, followed by the column in which the second portion of the TDU is stored, and so forth, until block 330 has been performed for all columns. In other embodiments, the order of the columns is not important.

Block 332 comprises determining the row(s) in the column of each bank that stores a portion of the TDU. There may be one or more rows, depending on the size of the TDU and the number of folds in the buffer. For instance, for a three-fold buffer and a full-sized TDU, there would be three rows in the column in which a portion of the TDU is stored.

Block 334 comprises informing a write allocation mechanism, such as allocator 150, that the row(s) will be read in an upcoming memory access cycle. This permits the allocation mechanism to avoid assigning writers to write to the row(s) at the same time.

Block 336 comprises reading, in each identified bank row, the bank entry at which the identified portion is stored. For instance, referring back to FIG. 1, if block 336 were being performed for TDU A and column 143*b*, this may comprise reading portions A.0 and A.5 from the entries in the respective banks 145 where they are stored.

Block 338 comprises freeing the entries that were read, so that they may be used to store other data unit portions. This may involve, for instance, updating a free list for each associated bank.

Finally, block 340 comprises sending the read portions to a downstream component configured to consume the data, such as a packet processor, traffic manager, or other suitable component. In an embodiment, the downstream component may be the same for all TDUs. In other embodiments, the downstream component may have been identified in an instruction to read the TDU (e.g. received in block 310).

In an embodiment, as block 330 is performed for each column, portions of the TDU may be cached until the TDU is completely read, so that the TDU may be reconstructed in the correct order prior to sending. In another embodiment, a downstream component is configured to perform such reconstruction based on metadata sent with the portions, and the reader may begin sending the portions immediately.

Flow 300 is but one example method flow for reading from a folded buffer. Other flows may include fewer, additional, or different steps in varying arrangements. For instance, in an embodiment, block 330 is performed for each portion individually, instead of for an entire column at once. That is, instead of having the reader perform the same number of read operations as the number of folds in the buffer, the reader may simply perform one read operation per memory access cycle.

In an embodiment, rather than reading from only a single bank in each row, the reader may be configured to read from two, three, or even all banks in a selected row. In an embodiment, a scheduler may schedule the reading of individual TDU portions. Portions for multiple TDUs may be read concurrently.

In an embodiment, read operations alternate with write operations. Hence, block 336 may be omitted. In yet other embodiments, read operations do not necessarily have priority over write operations, and so flow 300 may include a step of requesting to read certain rows and/or receiving indications of particular rows that can be read.

3.0. Packed Ingress Interface 3.1. System Overview

Figure 4:
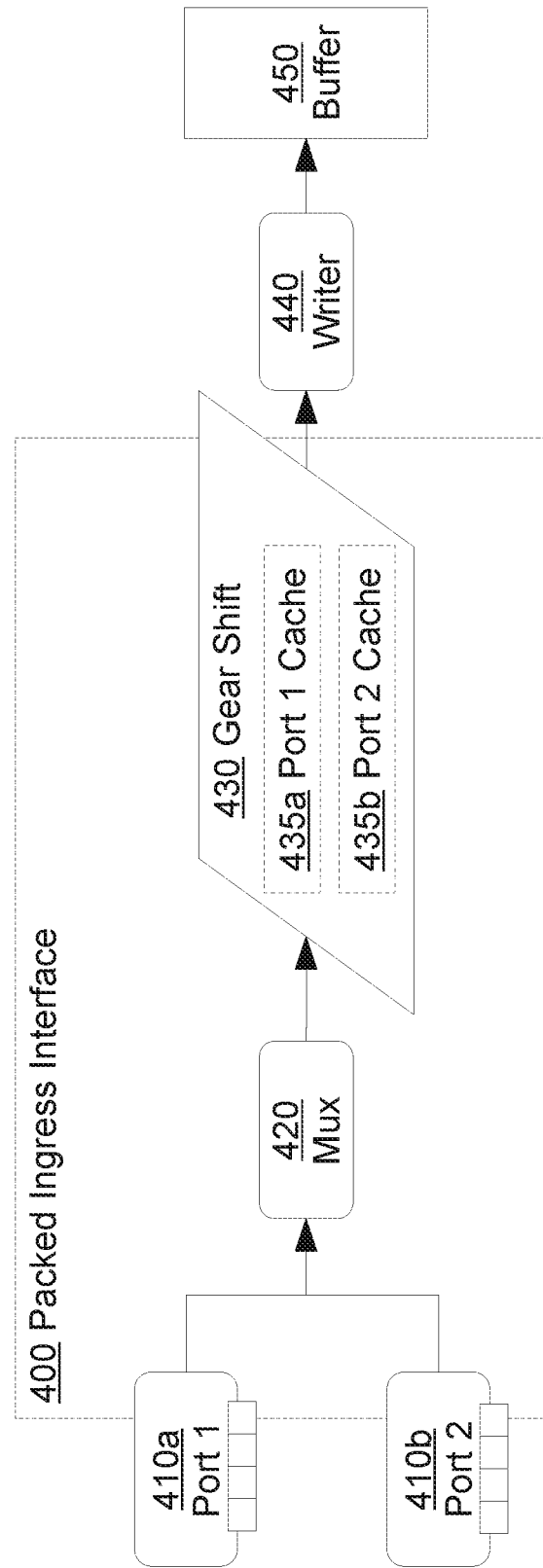
FIG. 4 is an illustrative view of various components of an example packed ingress interface.

FIG. 4 is an illustrative view of various components of an example packed ingress interface 400, according to an embodiment. The packed ingress interface 400 may be an input into any suitable component of a switch or other network device, as described elsewhere herein, or any other computing device. In an embodiment, some or all of the inputs into an ingress buffer, such as inputs 110 into ingress buffering subsystem 100, may be packed ingress interfaces 400. In yet other embodiments, packed ingress interfaces 400 may be used as inputs into more conventional buffers or other system components, without the specific details of ingress buffering subsystem 100. Conversely, ingress buffering subsystem 100 need not necessarily utilize packed ingress interface 400, though certain advantages may be realized in doing so.

In an embodiment, the various components of the packed ingress interface described below are hardware-based logic units within one or more application-specific integrated circuits (ASICs), field programmable gate arrays (FPGAs), or other integrated circuit(s). In other embodiments, some or all of the components may be software-based logic implemented by one or more processors executing instructions stored in one or more computer-readable media.

Ports and Multiplexor

Packed ingress interface 400 is coupled to a plurality of ports 410 which provide input into the interface 400. Each port 410 may be, for instance, a communication interface that receives data from a network, or any other suitable input. While only two ports 410 are depicted, the number of ports 410 may be different in other embodiments. Each port 410 outputs a data stream. The amount of data from the data stream that a port 410 transmits in a given input clock cycle is known as a data stream portion. In an embodiment, the data stream includes a number of fixed-size segments, and the stream is said to be packed at a granularity of that size. For instance, a 128-byte stream portion from a port 410 might be packed at a sixteen-byte granularity, meaning it has eight segments of sixteen bytes each. However, such a structure is not necessary in other embodiments. In an embodiment, a data stream may optionally include or be accompanied by metadata associated with the stream.

Packed ingress interface 400 includes a multiplexor 420. Each port 410 is coupled to the multiplexor 420. The ports 410 transmit their data streams to the multiplexor 420, which selects between the data transmitted by the ports 410 and outputs the selected data. Transmission logic directly or indirectly coupled to the multiplexor 420 may then send data unit portions downstream based on the data streams outputted from the multiplexor 420.

In an embodiment, multiplexor 420 selects between the ports 410 in alternation or a round-robin approach, so that each port 410 is selected at the same frequency. For instance, the multiplexor 420 may alternate between selecting between ports 410a and 410b every other clock cycle. As another example, there may be three ports 410, and the multiplexor 420 outputs data from each port 410 in once every three clock cycles.

In yet other embodiments, multiplexor 410 may be configured to intelligently select between ports 410 depending on whether the ports 410 have data available and/or a priority associated with that data.

In an embodiment, each port 410 is associated with a clock that is different from the one used by the multiplexor 420, such that they transmit new data to the multiplexor 420 at the same frequency that the multiplexor 420 selects to output the data from the port 410. Hence, for example, ports 410 might operate at half the speed as multiplexor 420, since they only need to provide data to multiplexor 410 once for every two of multiplexor 420's clock cycles. In yet other embodiments, the ports 410 need not necessarily be clocked differently than multiplexor 410, but may be configured to repeat transmission of the same data until read by multiplexor 420, or simply to be inactive in clock cycles when their data is not being consumed by multiplexor 420.

In the above examples, it is assumed that the multiplexor 420 outputs the same amount of data each of its clock cycles as the ports 410 receive in one of their clock cycles. That is, if a port 410 is configured to receive a 64-byte word each of its clock cycle, the multiplexor 420 would output a 64-byte word. In yet another embodiment, the bandwidth of multiplexor 420 is higher than that of ports 410. While a port 410 is waiting for the multiplexor 420 to select it, any data received by the port 410 is cached (e.g. in the port 410 or in the multiplexor 420). Then, when finally selected by the multiplexor 420, the port 410 outputs not only the latest data it has received, but also any data cached since the port 410 was last selected. Hence, in the depicted embodiment, if a port 410a had an incoming bandwidth of 64 bytes, there may also be a 64-byte cache for port 410a to cache any data received while multiplexor 420 was transmitting data for port 410b. The multiplexor 420 would then have a bandwidth of 128 bytes, so that when it was time again to transmit data for port 410a, it could also transmit the data in the cache.

Of course, various combinations of clock speed and bandwidth ratios may be used as well. For instance, a four-port embodiment might have each port 410 may run at half the clock speed as the multiplexor 420, but the outgoing multiplexor bandwidth may be double that of each port's incoming bandwidth.

In an embodiment, a port 410 may include logic for detecting defective data units, based on checksums, advertised data unit lengths, and so forth. The port 410 may include logic for dropping data for such data units when possible (e.g. by omitting data for the defective data units from the data stream). This may require some parsing and caching within each port 410 itself, so as to be able to look ahead fare enough to recognize incomplete or defective packets. Alternatively, such detection may be performed by downstream writers 440 or other components.

Port Cache

Because of the expectations of downstream components, ports 410 may be configured to transmit data for only one data unit per clock cycle. If it detects the end of a data unit (e.g. of a PDU or TDU, depending on the implementation), a port 410 may cease transmission for the clock cycle, or pad the remainder of the output with empty or insignificant data, so as to delay starting the next data unit until the next clock cycle.

According to other embodiments, however, it may be desirable that the ports 410 be capable of transmitting data for more than one data unit per clock cycle. This is because, in the foregoing approach, much of the port bandwidth may be wasted in clock cycles when transmission of a data unit concludes. For instance, if the port bandwidth is 64 bytes, and there are only two bytes left to transmit for the data unit, 62 bytes of bandwidth would be wasted. Consequently, packed ingress interface 400 may be configured to handle the receipt of data for more than one data unit per clock cycle. Nonetheless, the packed ingress interface 400 may hold back any data for the second data unit in a cache 435, and instead send it in subsequent clock cycles.

The cache 435 may be any suitable type of memory of suitable size to hold the data that needs to be cached. The cache may be a register, SRAM, or any other suitable type of memory of a suitable size. For instance, if the packed ingress interface 400 typically outputs 128 bytes, the cache might be a 128-byte register, or 128 bytes minus the typical size an interpacket gap, preamble, delimiter, and/or other mechanism for signaling data unit boundaries. In an embodiment, there are separate caches 435 for each port 410.

The multiplexor 420 or caching logic coupled thereto (undepicted) includes parsing logic configured to recognize a data unit boundary in the data it receives from a port 410. The data unit boundary may be, for instance, an interpacket gap, preamble, or other special sequence of characters, header, or any other type of signal. For instance, in an embodiment, the interpacket gap may be a discrete segment of the data stream that does not include any data (e.g. a sixteen-byte interpacket gap segment). In an embodiment, the location of the interpacket gap may be signaled in advance via information in a data unit header, and the multiplexor 420 or parser may remember the location.

Based upon this detection, the incoming stream is split into two different parts. The first part, which forms the last portion of the first data unit (TDU and/or PDU) whose data is in the stream, is sent downstream. The latter part, which is the start of the first portion of the second data unit, is placed in the cache 435. If an interpacket gap and/or preamble are included in the stream, they may optionally be stripped so as not to consume cache 435 space, bandwidth, and/or buffer 450 space.

In an embodiment, the data in the cache 435 may be held back and sent the next time the multiplexor 420 sends data for the associated port 410. This may mean, for instance, that the packed ingress interface 400 may send two data unit portions downstream on such occasions, as opposed to the typical one portion.

The multiplexor 420 may send metadata indicating which port the data stream it sends is for, so the caching logic knows when to release the cached data for the port 410, or the caching logic may be configured to alternate between ports in the same manner as the multiplexor 420.

Gear Shift

In an embodiment, it is preferable that the first portion, or even all but the last portion, of a data unit to be stored in the buffer is a full-size data unit portion. The preference may be to optimize buffer usage by avoiding buffering non-full portions when possible. For instance, if storage of a full-size TDU requires exactly eight full-size data unit portions, and the first portion stored for a certain full-size TDU is smaller than the maximum portion size, the certain TDU would need a ninth data unit portion in the buffer to store leftover data at the end of the TDU. The preference may also or instead be on account of other downstream components that comprise logic configured around the assumption that the first portion—or even all portions but the last—of a TDU and/or PDU are a certain number of bytes (e.g. the width of an ingress buffer bank). For instance, the folded buffering logic may assume that there will always be the same number of portions in a full-size TDU, which as explained above is not possible if the first portion is not full-size. Similarly, there may be packet processing logic that is configured to read exactly a certain number of bytes from the buffer, which would be incompatible with a variable-size starting portion.

In view of these and other considerations, in some embodiments, the caching logic of the packed ingress interface 400 may be gear shifting logic 430, also referred to as a gear shift 430, configured to send data for a data unit in a rolling manner, based on both the data stream sent by the multiplexor and a cache 435. The gear shift 430 merges data from the data stream with the data that has been cached from the corresponding port to form a merged data unit portion of up to the maximum data unit portion size in length. The transmission logic then outputs the merged data unit portion downstream. Any unsent data remaining from the end of the stream is placed in the cache 435.

Whenever the incoming data stream portion is filled only with data for the same data that the cache 435 is caching data for, the foregoing scheme is relatively simple. Suppose, for instance, the cache 435 for a certain port includes two sixteen-byte segments, and that the size of both the stream and a full-size data unit portion is eight sixteen-byte segments (or 128 bytes). For each input clock cycle that data from the port is processed, the packed ingress interface 400 will send eight segments downstream—two from the cache 435, and six from the stream. The final two segments from the stream will be placed in the cache 435.

However, when the end of a data unit is detected in the stream, the packed ingress interface 400 is configured to send all of the rest of the data for the data unit downstream, even if it means sending a second data unit portion that carries any data that would not fit in merged data unit portion. Moreover, if the incoming data stream portion also includes the start of another data unit, the data for the next data unit may be placed in the cache 435.

Figure 5:
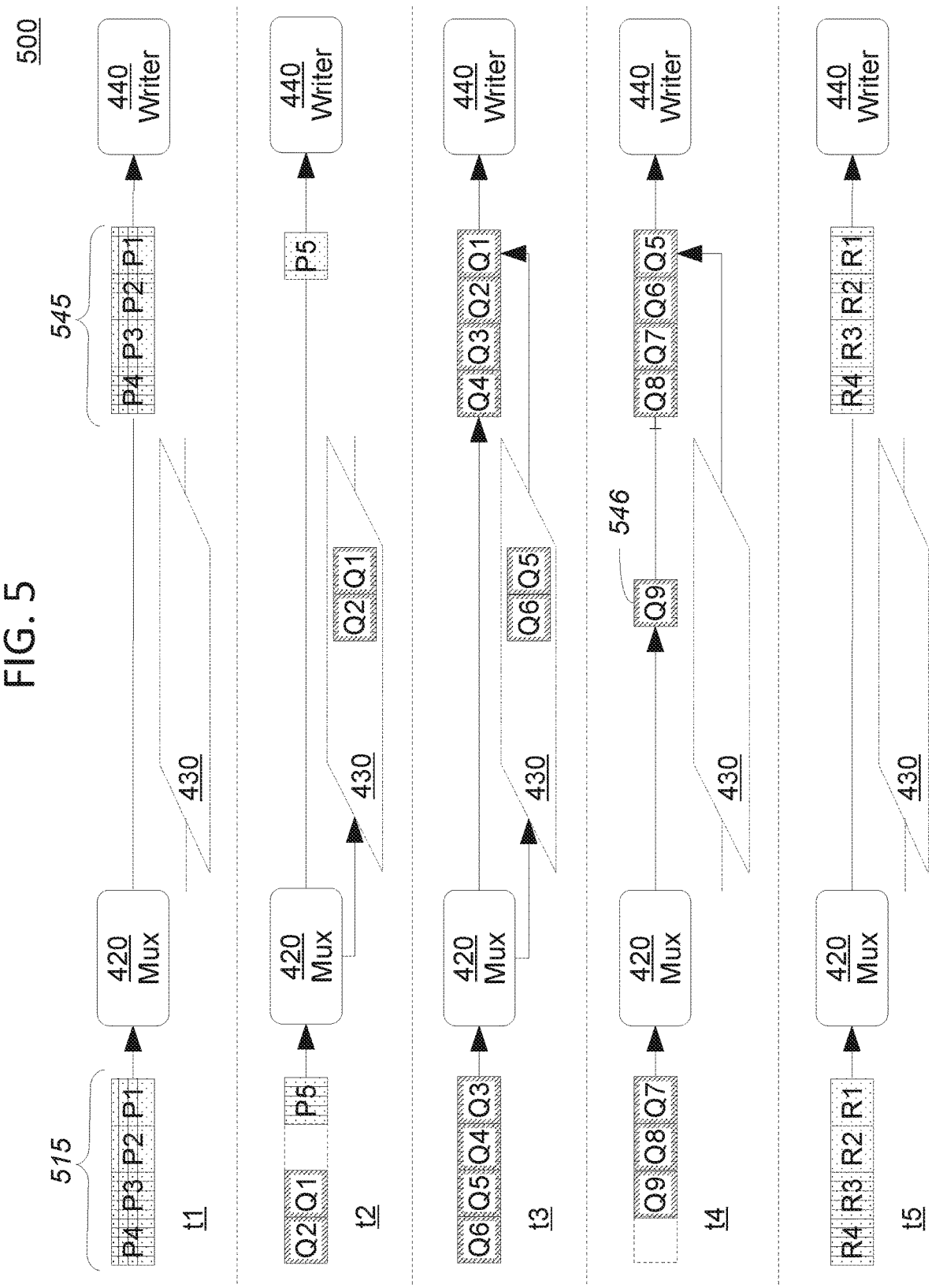
FIG. 5 illustrates the flow of several data units through an example packed ingress interface over the course of several instances of time.

To illustrate operation of the gear shifting logic 430, consider the example given in FIG. 5, which illustrates the flow of several data units through an example packed ingress interface over the course of several instances of time t0-t5, according to an embodiment. A different four segment data stream portion 515 from a single port (not depicted) is delivered to mux 420 at each of t0-t5. For ease of explanation, no additional data streams from other ports are depicted, though other data streams from other ports coupled to mux 420 could be received at other times between t0-t5, and cached separately if needed. Transmission logic coupled to the mux 420 then sends a data unit portion 545 downstream towards a writer 440. Data stream portion 515 and its associated segments may be of any size. For instance, and without limitation, each segment may be sixteen bytes, making the stream portion 515 sixty-four bytes.

At t0, the segments of the data stream portion 515 are P1-P4, which are all segments of a same data unit P. The gear shift 430 is not used, and the complete data stream portion 515 is simply passed on as data unit portion 545 without modification.

At t1, the segments of the data stream portion 515 include P5, Q1, and Q2. The second segment, between P5 and Q1, is empty, signaling an interpacket gap and the end of the data unit P. Segment P5 is passed on by itself as the data unit portion 545, while Q1 and Q2, which are segments of a data unit Q, are cached by the gear shift 430.

At t2, the segments of the data stream portion 515 include Q3-Q6, which are all segments of the data unit Q. The gear shift 430 places the previously cached segments Q1 and Q2 on the line, and these are followed by segments Q3 and Q4, thereby forming a merged data unit portion 545 comprising segments Q1-Q4. This merged data unit portion 545 is outputted to the writer 440, while the segments Q5 and Q6 are cached by the gear shift 430.

At t3, the segments of the data stream portion 515 include Q7-Q9, which again are all segments of the data unit Q. The gear shift 430 places the previously cached segments Q5 and Q6 on the line, and these are followed by segments Q7 and Q8, thereby forming a merged data unit portion 545 comprising segments Q5-Q8. This merged data unit portion 545 is outputted to the writer 440. Meanwhile, an interpacket gap is found at the end of the data stream 515, indicating that any remaining segments of the data unit Q should also be sent downstream. Since the data unit portion 545 is already full, however, the last part of the data unit—segment Q9—is sent as a separate second data unit portion 546. The data stream portion 515 includes no further data, so gear shift 430 does not need to cache new data.

At t4, the segments of the data stream 515 are R1-R4, which are all segments of a same data unit R. The gear shift 430 is not used, and the data stream portion 515 is simply passed on as data unit portion 545 without modification.

Writer/Buffer

Packed ingress interface 400 outputs data to a writer 440, which writes the data to a buffer 450. Writer 440 may be any suitable write logic for any suitable type of buffer, but in at least some embodiments, writer 440 is a writer 120 into the folded buffer 140 described above.

In an embodiment, to properly handle the data unit portions it receives from the packed ingress interface, a writer 440 must be configured to recognize the source of the data unit portion. Hence, for instance, the packed ingress interface 400 may be configured to send metadata indicating the port over which the currently outputted data was received. The writer 440 may then select the correct TDU to which the data belongs, and place the data in the appropriate place(s) in the buffer 450, using techniques such as described in previous sections. In some embodiments, such metadata may also include information indicating when the data is the end of a TDU or PDU. In yet other embodiments, the writer 440 is configured to assume that data is from a certain port based on the clock cycle in which it was received, following the same pattern as the mux 420 uses to select between ports 410.

In some embodiments, the writer 440 must be further configured to write more than one data unit portion received from upstream (e.g. in case it receives two data unit portions at the same time, such as data unit portions 545 and 546 at t3 in FIG. 5). In an embodiment, the writer 440 is capable of writing to two or more banks in the buffer 450 simultaneously, when needed. For instance, if the buffer 450 is arranged in rows and columns, such as used for buffer 140, the writer 440 may be configured to write to banks in two different columns in the same row at the same time. Of course, any other manner of allowing a writer 440 multiple write opportunities in the same memory access cycle may instead utilized.

While only one writer 440 is depicted for simplicity, there may be many additional writers 440 into the buffer 450, each of which may be coupled to a different packed ingress interface 400 or other input mechanism for a different set of ports 410.

Miscellaneous

Packed ingress interface 400 is merely an example of a packed ingress interface in which the described techniques may be practiced. Other implementations may include fewer and/or additional components in varying arrangements, and the distribution of work between components may likewise vary.

In an embodiment, there is only a single port 410 and no multiplexor 420, meaning there is only one port 410 for the writer 440. The gear shift 430 and cache 435 may still be utilized to permit the port 410 to send data for more than one data unit in a single clock cycle.

In some embodiments, neither caches 435 nor the gear shift 450 are needed because the ports are configured to not send data for more than one data unit in a single clock cycle. In another embodiment, caches 435 are still utilized to hold back data for a second data unit that may have been received in the same clock cycle, but a gear shift 430 is not needed, since there are no constraints on the size of the first portion of a data unit. In yet another embodiment, a writer 440 may be configured to write data unit portions for separate data units in the same clock cycle (e.g. to different banks in the same row), thus allowing a port to transmit data for multiple data units without the need for caches 435. In any event, the multiplexor 420 and multiple ports 410 may still be used in some or all of these embodiments.

3.2. Functional Overview

Figure 6:
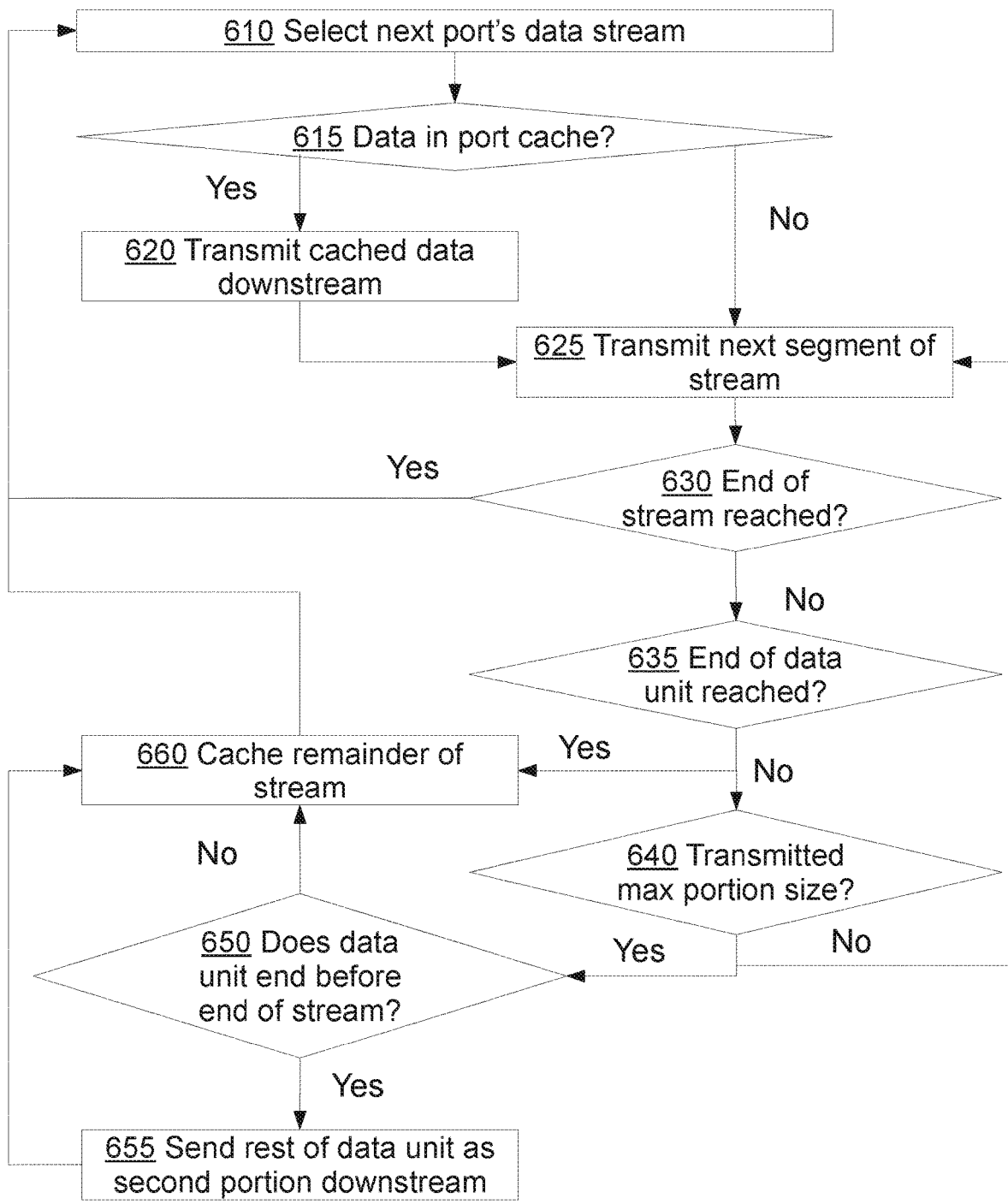
FIG. 6 illustrates an example flow for implementing a packed ingress interface.

FIG. 6 illustrates an example flow 600 for implementing a packed ingress interface, according to an embodiment. Flow 600 may be performed within the switches and network devices described in other sections and/or in other computing devices. In an embodiment, flow 600 may be performed by packed ingress interface 400, though flow 600 may similarly be performed by other components, and packed ingress interface 400 need not be limited specifically to performance of flow 600.

Block 610 comprises selecting a next data stream to process. In embodiments where the implementing component multiplexes data streams from multiple ports, this may comprise selecting a next port to process. For instance, if this is the first iteration of flow 600, the next port might simply be the first port in a list to be processed, while the next iteration of flow 600 would process the next port in the list, and so on, in round-robin fashion. Or, in an embodiment block 610 may comprise intelligently selecting a port to process next, based on priority levels, port activity, and so forth. In other embodiments, there may be a single port. Block 610 may simply comprise reading data from that port (e.g. in a new input clock cycle).

For any given iteration of flow 600, the selected data stream provides a portion of data up to a maximum data unit portion size. In an embodiment, the data stream may be subdivided into fixed-size segments, and the port may pad the data in each segment to fill the segment entirely. Different embodiments may feature different segment sizes. For instance, depending on the embodiment, a segment might be sixteen bytes, eight bytes, a bit, or any other suitable size.

In an embodiment, some segments may be blank or empty, signaling the end of a data unit and/or the lack of any additional data being received by the port. In an embodiment, the entire data stream may at times be empty, in which case flow 600 is not performed. Note that, in some embodiments, parsing logic may be required to determine whether a segment or data stream portion is actually empty, based on the data itself or on interpreting the data based on information from previous portions of the stream (e.g. the inclusion or lack of certain data unit header fields, preambles, delimiters, etc.).

Block 615 comprises determining whether there is already data for the port in a cache, such as a cache 435. If so, flow 600 proceeds to block 620. Otherwise, flow 600 proceeds to block 625.

Block 620 comprises transmitting any data in the cache downstream. For instance, the transmission logic of a packed ingress interface may transmit the data to a writer or buffering subsystem. The data forms the first part of a data unit portion that is outputted as a result of flow 600. Block 620 then proceeds to block 625.

Block 625 comprises transmitting the first segment of the stream downstream, or the next segment if block 625 has already been performed one or more times in this iteration of flow 600. The transmitted segment is added on to any data already sent, thereby being incorporated into the data unit portion that is being outputted as a result of flow 600.

Block 630 comprises determining if the end of the stream has been reached, as would occur if flow 600 has already looped through block 625 a number of times equal to the number of segments received in block 610, or if the stream had fewer than the maximum number of segments this iteration flow of 600.

If the end of the data stream has been reached, flow 600 concludes, and a new iteration of flow 600 begins at block 610. Otherwise, flow 600 proceeds to block 635.

Block 635 comprises determining whether the end of a data unit has been reached. For instance, block 635 may comprise determining if the next segment comprises data that signals the boundary between data units, such as an interpacket gap or preamble. Or, block 635 may comprise comparing a running counter of data unit length to a length announced in a header field at the beginning of the data unit.

If the end of the data unit has been reached, flow 600 proceeds to block 660. Otherwise, flow 600 proceeds to block 640.

Block 640 comprises determining whether the maximum portion size has already been transmitted in this iteration of flow 600, meaning that the data unit portion being transmitted is complete. For instance, if the maximum data unit portion size is 64 bytes, block 640 might comprise determining whether a counter reflecting the sum of data transmitted in blocks 620 and each loop of block 625 was equal to 64 bytes.

If the maximum data unit portion size has not been transmitted, flow 600 loops back to block 625. Otherwise, flow 600 proceeds to block 650.

Block 650 comprises determining whether the current data unit ends before the end of the stream, using logic similar to that of block 630. If so, then a second data unit portion is transmitted in block 655, comprising any segments of the data unit remaining in the stream. Otherwise, flow 600 proceeds to block 660.

Block 660 comprises caching the remainder of the stream so that it may be sent in subsequent iterations of flow 600. Flow 600 then concludes and a new iteration begins at block 610.

Flow 600 is but one example method flow for implementing a packed ingress interface. Other flows may include fewer or additional steps in varying arrangements. For instance, in an embodiment, the packed ingress interface implements only muxing, and hence the only blocks that would be performed are blocks 610, 625, and 630. In an embodiment, instead of merging the cached data with the data stream, the cached data is transmitted as a separate portion up front, thus obviating the need for various determinations of flow 600.

In an embodiment, the order of the various determinations of blocks 630-650 may be different. In an embodiment, instead of iteratively transmitting segments of the data unit portion by looping through each segment of the stream in blocks 625-640, a parser may analyze the stream and determine how much data from the data stream should be transmitted up front. The cached data may be merged with a first part of the stream, and then the entire merged data unit portion may be transmitted, as well as a second data unit portion if necessary. Of course, any other arrangements of logic to similar effect may be made.

Optionally, when the end of a data unit is detected in block 635 or block 655, a signal may be sent downstream indicating the end of the data unit, either in-band, or as sideband data, depending on the embodiment.

Flow 600 may be repeated any number of times, potentially concurrently for some or all ports connected to the implementing component. In an embodiment, the various elements of flow 600 may be pipelined. For instance, while contents of one data stream are being transmitted downstream in block 665 of one iteration of flow 600, other iterations of flow 600 may be executing other elements of flow 600 with respect to other data streams (e.g. receiving another data stream in block 610). The pipeline may comprise varying numbers of stages, allowing varying numbers of concurrent iterations, depending on the embodiment.

4.0. Example Network Device

This section describes, in greater detail, example network devices in which the components and techniques described herein may be implemented. However, the techniques described herein are also useful in switches and contexts other than those described in this section.

4.1. Networks

Figure 7:
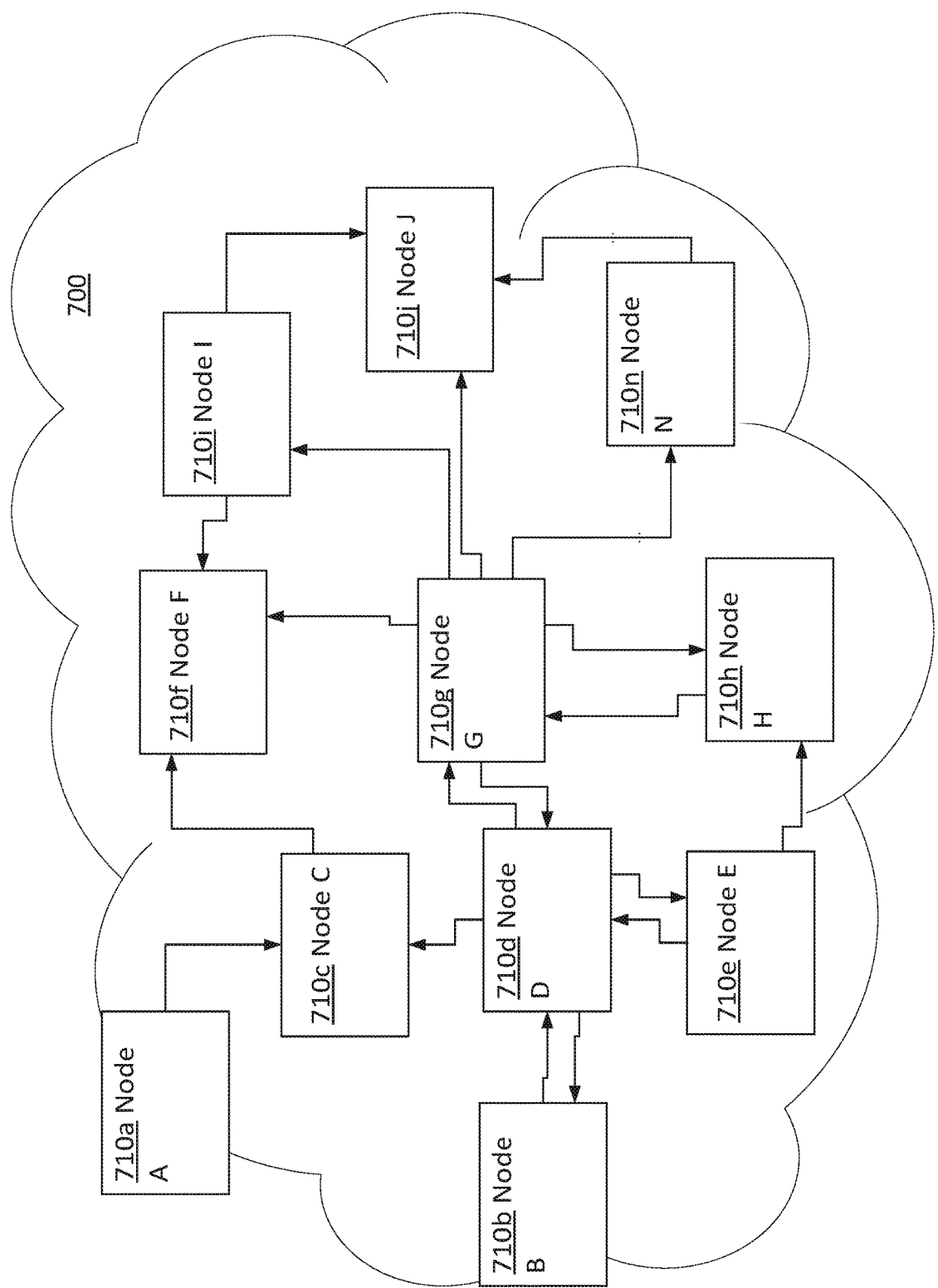
FIG. 7 is an illustrative view of various aspects of an example networking system in which the techniques described herein may be practiced.

FIG. 7 is an illustrative view of various aspects of an example networking system 700, also referred to as a network, in which the techniques described herein may be practiced, according to an embodiment. Networking system 700 comprises a plurality of interconnected nodes 710a-710n (collectively nodes 710), each implemented by a different computing device. For example, a node 710 may be a single networking computing device, such as a router or switch, in which some or all of the processing components described herein are implemented in application-specific integrated circuits (ASICs), field programmable gate arrays (FPGAs), or other integrated circuit(s). As another example, a node 710 may include one or more memories storing instructions for implementing various components described herein, one or more hardware processors configured to execute the instructions stored in the one or more memories, and various data repositories in the one or more memories for storing data structures utilized and manipulated by the various components.

Each node 710 is connected to one or more other nodes 710 in network 700 by one or more communication links, depicted as lines between nodes 710. The communication links may be any suitable wired cabling or wireless links. Note that system 700 illustrates only one of many possible arrangements of nodes within a network. Other networks may include fewer or additional nodes 710 having any number of links between them.

4.2. Data Units

While each node 710 may or may not have a variety of other functions, in an embodiment, each node 710 is configured to send, receive, and/or relay data to one or more other nodes 710 via these links. In general, data is communicated as series of discrete units or structures of data represented by signals transmitted over the communication links.

Different nodes 710 within a network 700 may send, receive, and/or relay data units at different communication levels, or layers. For instance, a first node 710 may send a unit of data at the network layer (e.g. a TCP segment) to a second node 710 over a path that includes an intermediate node 710. This unit of data will be broken into smaller units of data at various sublevels before it is transmitted from the first node 710. These smaller data units may be referred to as "subunits" or "portions" of the larger data unit.

For example, a TCP segment may be broken into packets, then cells, and eventually sent out as a collection of signal-encoded bits to the intermediate device. Depending on the network type and/or the device type of the intermediate node 710, the intermediate node 710 may rebuild the entire original data unit before routing the information to the second node 710, or the intermediate node 710 may simply rebuild certain subunits of data (e.g. frames and/or cells) and route those subunits to the second node 710 without ever composing the entire original data unit.

When a node 710 receives a unit of data, it typically examines addressing information within the unit of data (and/or other information within the unit of data) to determine how to process the unit. The addressing information may be, for instance, an Internet Protocol (IP) address, MPLS label, or any other suitable information. If the addressing information indicates that the receiving node 710 is not the destination for the data unit, the receiving node 710 may look up the destination node 710 within the receiving node's routing information and route the data unit to another node 710 connected to the receiving node 710 based on forwarding instructions associated with the destination node 710 (or an address group to which the destination node belongs). The forwarding instructions may indicate, for instance, an outgoing port over which to send the unit of data, a label to attach the unit of data, etc. In cases where multiple paths to the destination node 710 are possible, the forwarding instructions may include information indicating a suitable approach for selecting one of those paths, or a path deemed to be the best path may already be defined.

Addressing information, flags, labels, and other metadata used for determining how to handle a data unit are typically embedded within a portion of the data unit known as the header. The header is typically at the beginning of the data unit, and is followed by the payload of the data unit, which is the information actually being sent in the data unit. A header is typically comprised of fields of different types, such as a destination address field, source address field, destination port field, source port field, and so forth. In some protocols, the number and the arrangement of fields may be fixed. Other protocols allow for arbitrary numbers of fields, with some or all of the fields being preceded by type information that explains to a node the meaning of the field.

A node 710 may operate on network data at several different layers, and therefore view the same data as belonging to several different types of data units. At a higher level, a node 710 may view data as belonging to protocol data units ("PDUs") of a certain type, such as packets or data units at any other suitable network level. The node 710 need not necessarily ever assemble the data in a PDU together, but rather may in an embodiment act upon constituent portions of the PDU, which may be linked together by identifiers, linked lists, or other suitable constructs. These portions are referred to herein as transport data units ("TDUs"). For instance, if the PDU is a packet, the TDU might be one or more cells or frames. The first TDU in a PDU is referred to as the start-of-packet ("SOP"), while the last TDU in the PDU is referred to as the end-of-packet ("EOP").

Generally speaking, the TDU is the largest contiguous unit of data that certain internal components of a node 710 are configured to communicate between each other in a given period of time. For instance, a node 710 may have a traffic manager that is capable of receiving no more than a single TDU from each input interface it is connected to during a single clock cycle of the traffic manager. Additionally, though not necessarily the case in all embodiments, in at least some embodiments, the contiguous portions of data sent by each port of a node 710 in a given period of time may be no larger than a TDU. In an embodiment, each TDU is of a fixed size, except for the last TDU in a PDU, which may be of a size less than the fixed size.

In some embodiments, for physical storage purposes, a TDU may further be divided into chunks referred to as storage data units ("SDUs"). In an embodiment, an SDU is the largest contiguous portion of data that may be stored in a physical buffer entry of a particular buffer. In other words, the maximum size of an SDU is the same as the maximum size of a physical buffer entry. In an embodiment, the maximum number of SDUs in a TDU is fixed. However, an EOP TDU may have less than this number of SDUs. Moreover, the last SDU in a TDU (e.g. the EOP TDU) may be smaller than maximum SDU size.

In an embodiment, TDU and SDU boundaries may be relative to the component acting upon the data. That is, for example, a node 710 whose traffic manager is configured to use TDUs of a first size and SDUs of a second size may further include other components configured to communicate or buffer data units of sizes other than the first size and the second size.

For convenience, many of the techniques described in this disclosure are described with respect to embodiments where the PDUs are IP packets in a L3 (level 3) network, and the TDUs are the constituent cells and frames thereof in an L2 (level 2) network, in which contexts the described techniques have particular advantages. It will be recognized, however, that these techniques may also be applied to realize advantages in routing other types of data units conforming to other protocols and/or at other communication layers within a network. Thus, unless otherwise stated or apparent, the techniques described herein should also be understood to apply to contexts in which the PDUs, TDUs, and SDUs are of any other types of data structures communicated across a network, such as segments, InfiniBand Messages, or datagrams. That is, in these contexts, other types of data structures may be used in place of packets, cells, frames, and so forth.

4.3. Network Paths

Any node in the depicted network 700 may communicate with any other node in the network 700 by sending data units through a series of nodes 710 and links, referred to as a path. For example, Node B (510b) may send data units to Node H (510h) via a path from Node B to Node D to Node E to Node H. There may be a large number of valid paths between two nodes. For example, another path from Node B to Node H is from Node B to Node D to Node G to Node H.

In an embodiment, a node 710 does not actually need to specify a full path for a data unit that it sends. Rather, the node 710 may simply be configured to calculate the best path for the data unit out of the device (e.g. which egress port it should send the data unit out on). When a node 710 receives a data unit that is not addressed directly to the node 710, based on header information associated with a data unit, such as path and/or destination information, the node 710 relays the data unit along to either the destination node 710, or a "next hop" node 710 that the node 710 calculates is in a better position to relay the data unit to the destination node 710. In this manner, the actual path of a data unit is product of each node 710 along the path making routing decisions about how best to move the data unit along to the destination node 710 identified by the data unit.

4.4. Network Device

Figure 8:
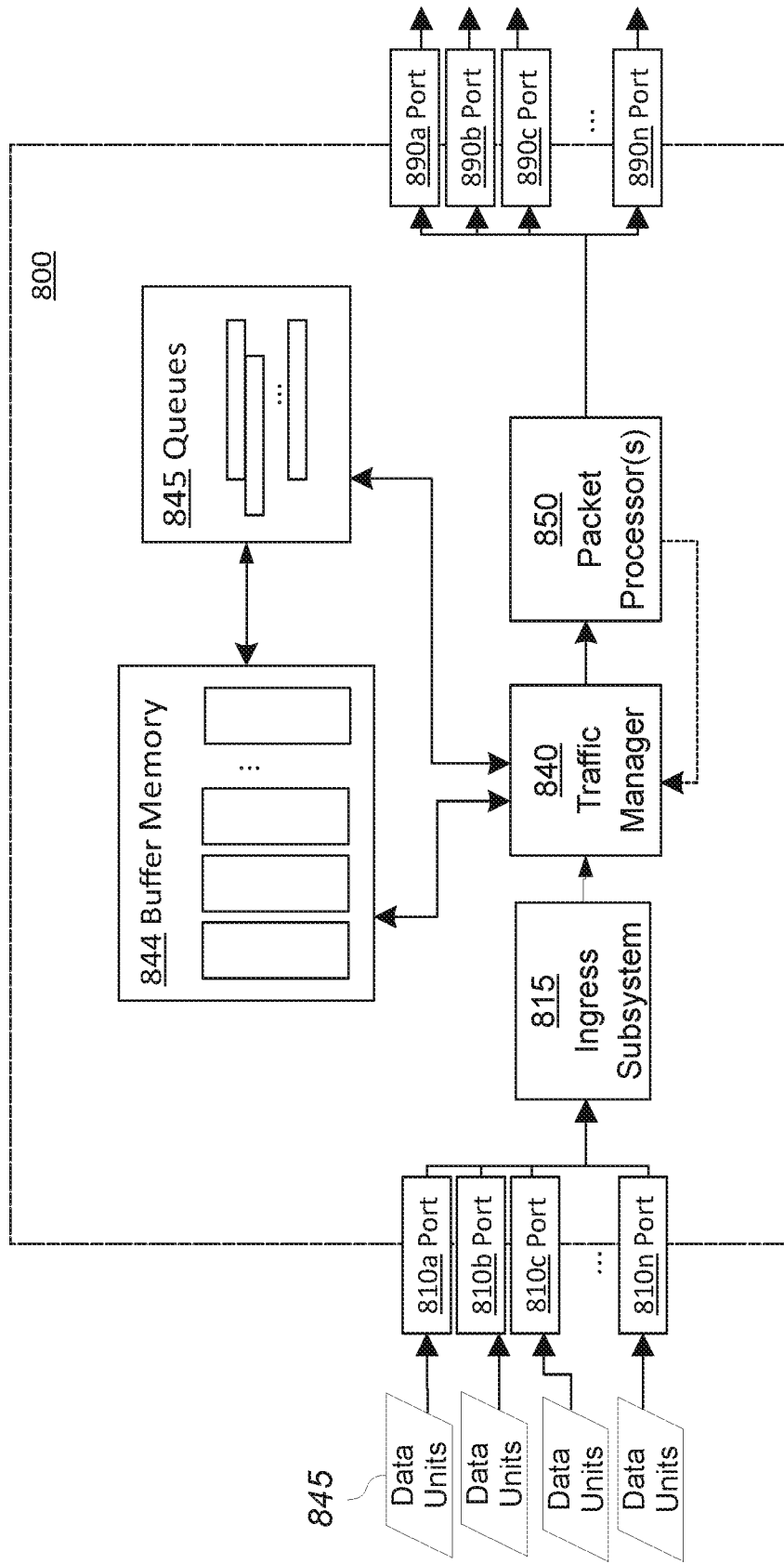
FIG. 8 is an illustrative view of various aspects of an example network device in which techniques described herein may be practiced.

FIG. 8 is an illustrative view of various aspects of an example network device 800 in which techniques described herein may be practiced, according to an embodiment. Network device 800 is a computing device comprising any combination of hardware and software configured to implement the various logical components described herein, including components 810-890. For example, the apparatus may be a single networking computing device, such as a router or switch, in which some or all of the components 810-890 described herein are implemented using application-specific integrated circuits (ASICs) or field programmable gate arrays (FPGAs). As another example, an implementing apparatus may include one or more memories storing instructions for implementing various components described herein, one or more hardware processors configured to execute the instructions stored in the one or more memories, and various data repositories in the one or more memories for storing data structures utilized and manipulated by various components 810-890.

Device 800 is generally configured to receive and forward data units 805 to other devices in a network, such as network 700, by means of a series of operations performed at various components within the device 800. Note that certain nodes 710 in a system such as network 700 may each be or include a separate network device 800. In an embodiment, a node 710 may include more than one device 800. In an embodiment, device 800 may itself be one of a number of components within a node 710. For instance, network device 800 may be an integrated circuit, or "chip," dedicated to performing switching and/or routing functions within a network switch or router. The network switch or router may further comprise one or more central processor units, storage units, memories, physical interfaces, LED displays, or other components external to the chip, some or all of which may communicate with the chip.

A non-limiting example flow of a data unit 805 through various subcomponents of the switching logic of device 800 is as follows. After being received via a port 810, a data unit 805 may be buffered by an arbiter (not depicted) until the data unit 805 can be processed by an ingress packet processor 850, and then delivered to an interconnect (not depicted). From the interconnect, the data unit 805 may be forwarded to a traffic manager 840. The traffic manager 840 may store the data unit 805 in a buffer 844 and assign the data unit 805 to a queue 845. The traffic manager 840 manages the flow of the data unit 805 through the queue 845 until the data unit 805 is released to an egress packet processor 850. Depending on the processing, the traffic manager 840 may then assign the data unit 805 to another queue so that it may be processed by yet another egress processor 850, or the egress packet processor 850 may send the data unit 805 to an egress arbiter (not depicted) from which the data unit 805 is finally forwarded out another port 890. Of course, depending on the embodiment, the switching logic may omit some of these subcomponents and/or include other subcomponents in varying arrangements.

Example components of a device 800 are now described in further detail.

4.5. Ports

Network device 800 includes ports 810/690. Ports 810, including ports 810a—n, are inbound ("ingress") ports by which data units 805 are received over a network, such as network 700. Ports 890, including ports 890a—n, are outbound ("egress") ports by which at least some of the data units 805 are sent out to other destinations within the network, after having been processed by the network device 800.

Data units 805 may be of any suitable PDU type, such as packets, cells, frames, etc. In an embodiment, data units 805 are packets. However, the individual atomic data units upon which the depicted components operate may actually be subunits of the data units 805, such as the previously described TDU. For example, data units 805 may be received, acted upon, and transmitted at a cell or frame level. These cells or frames may be logically linked together as the data units 805 (e.g. packets) to which they respectively belong for purposes of determining how to handle the cells or frames. However, the subunits may not actually be assembled into data units 805 within device 800, particularly if the subunits are being forwarded to another destination through device 800.

Ports 810/690 are depicted as separate ports for illustrative purposes, but may actually correspond to the same physical hardware ports (e.g. network jacks or interfaces) on the network device 810. That is, a network device 800 may both receive data units 805 and send data units 805 over a single physical port, and the single physical port may thus function as both an ingress port 810 and egress port 890. Nonetheless, for various functional purposes, certain logic of the network device 800 may view a single physical port as a separate ingress port 810 and egress port 890. Moreover, for various functional purposes, certain logic of the network device 800 may subdivide a single physical ingress port or egress port into multiple ingress ports 810 or egress ports 890, or aggregate multiple physical ingress ports or egress ports into a single ingress port 810 or egress port 890. Hence, in various embodiments, ports 810 and 890 should be understood as distinct logical constructs that are mapped to physical ports rather than simply as distinct physical constructs.

In some embodiments, the ports 810/690 of a device 800 may be coupled to one or more transceivers, such as Serializer/Deserializer ("SerDes") blocks or other suitable components, by which device 800 receives and sends data.

4.6. Packet Processors

A device 800 comprises one or more packet processing components 850. These packet processors 850 may be any suitable combination of fixed circuitry and/or software-based logic, such as specific logic components implemented by one or more Field Programmable Gate Arrays (FPGAs) or Application-Specific Integrated Circuits (ASICs), or a general-purpose processor executing software instructions.

Different packet processors 850 may be configured to perform different packet processing tasks. These tasks may include, for example, identifying paths along which to forward data units 805, forwarding data units 805 to egress ports 890, implementing flow control and/or other policies, manipulating packets, performing statistical or debugging operations, and so forth. A device 800 may comprise any number of packet processors 850 configured to perform any number of processing tasks.

In an embodiment, the packet processors 850 within a device 800 may be arranged such that the output of one packet processor 850 may, eventually, be inputted into another packet processor 850, in such a manner as to pass data units 805 from certain packet processor(s) 850 to other packet processor(s) 850 in a sequence of stages, until finally disposing of the data units 805 (e.g. by sending the data units 805 out an egress port 890, "dropping" the data units 805, etc.). The exact set and/or sequence of packet processors 850 that process a given data unit 805 may vary, in some embodiments, depending on attributes of the data unit 805 and/or the state of the device 800. Any number of packet processors 850 may be chained together in this manner.

Based on decisions made while processing a data unit 805, a packet processor 850 may, in some embodiments, and/or for certain processing tasks, manipulate a data unit 805 directly. For instance, the packet processor 850 may add, delete, or modify information in a data unit header or payload. In other embodiments, and/or for other processing tasks, a packet processor 850 may generate control information that accompanies the data unit 805, or is merged with the data unit 805, as the data unit 805 continues through the device 800. This control information may then be utilized by other components of the device 800 to implement decisions made by the packet processor 850.

In an embodiment, a packet processor 850 need not necessarily process an entire data unit 805, but may rather only receive and process a subunit of a data unit 805, such as a TDU comprising header information for the data unit. For instance, if the data unit 805 is a packet comprising multiple cells, the first cell, or a first subset of cells, might be forwarded to a packet processor 850, while the remaining cells of the packet (and potentially the first cell(s) as well) are forwarded in parallel to a merger component where they await results of the processing.

Ingress and Egress Processors

In an embodiment, a packet processor may be generally classified as an ingress packet processor 850 or an egress packet processor 850. Generally, an ingress processor 850 resolves destinations for a traffic manager 840 to determine which ports 890 and/or queues 845 a data unit 805 should depart from. There may be any number of ingress processors 850, including just a single ingress processor 850.

In an embodiment, an ingress processor 850 performs certain intake tasks on data units 805 as they arrive. These intake tasks may include, for instance, and without limitation, parsing data units 805, performing routing related lookup operations, categorically blocking data units 805 with certain attributes and/or when the device 800 is in a certain state, duplicating certain types of data units 805, making initial categorizations of data units 805, and so forth. Once the appropriate intake task(s) have been performed, the data units 805 are forwarded to an appropriate traffic manager 840, to which the ingress processor 850 may be coupled directly or via various other components, such as an interconnect component.

The egress packet processor(s) 850 of a device 800, by contrast, may be configured to perform non-intake tasks necessary to implement the switching logic of the device 800. These tasks may include, for example, tasks such as identifying paths along which to forward the data units 805, implementing flow control and/or other policies, manipulating data units, performing statistical or debugging operations, and so forth. In an embodiment, there may be different egress packet processors(s) 850 assigned to different flows or other categories of traffic, such that not all data units 805 will be processed by the same egress packet processor 850.

In an embodiment, each egress processor 850 is coupled to a different group of egress ports 890 to which they may send data units 805 processed by the egress processor 850. In an embodiment, access to a group of ports 890 may be regulated via an egress arbiter coupled to the egress packet processor 850. In some embodiments, an egress processor 850 may also or instead be coupled to other potential destinations, such as an internal central processing unit, a storage subsystem, or a traffic manager 840.

4.7. Buffers

Since not all data units 805 received by the device 800 can be processed by the packet processor(s) 850 at the same time, various components of device 800 may temporarily store data units 805 in one or more buffers 844 while the data units 805 are waiting to be processed. For example, a certain packet processor 850 may only be capable of processing a certain number of data units 805, or portions of data units 805, in a given clock cycle, meaning that other data units 805, or portions of data units 805, destined for the packet processor 850 must either be ignored (e.g., dropped) or stored. At any given time, a large number of data units 805 may be stored in the buffers 844 of the device 800, depending on network traffic conditions.

A device 800 may include a variety of buffers 844, each utilized for varying purposes and/or components. Generally, a data unit 805 awaiting processing by a component is held in a buffer 844 associated with that component until the data unit 805 is "released" to the component for processing. For example, a traffic manager 840 will typically have a relatively large buffer 844, referred to as an egress buffer, in which it buffers data units 805 prior to releasing those data units 850 to an egress packet processor 850.

A buffer 844 may be implemented using a single physical memory unit (e.g. SRAM, DRAM, etc.), a designated portion of a memory unit, or a collection of memory units, depending on an embodiment. The buffer 844 is divided into addressable units, or entries, that store SDUs, one or more of which form a TDU, as explained elsewhere. Each TDU stored in a buffer 844 belongs to a PDU. However, the data for the SDUs and/or TDUs that belong to a PDU may not necessarily be stored adjacent to each other. If one wishes to reconstruct a PDU based on the buffered SDUs, one might be unable to do so using the buffer memory alone. Therefore, in an embodiment, a buffer 844 may further store or be associated with linking data that indicates which SDUs belong to a given TDU and/or which TDUs belong to a given PDU, also referred to as intra-packet link data.

For each PDU, buffer 844 may further store or be associated with various PDU metadata. The PDU metadata may include any suitable information about a PDU, such as a PDU identifier, location(s) of linking data for the PDU (e.g. the address(es) of intra-packet entr(ies) at which the linked list(s) for the PDU start), a count of TDUs in the PDU, source information, destination information, control information, timestamps, statistics, an assigned queue, flow control information, and so forth.

4.8. Queues

In an embodiment, to manage the order in which data units 805 are processed from buffers 844, various components of a device 800 may implement queueing logic. For example, the flow of data units 805 through the egress buffers 844 of traffic manager 840 may be managed using egress queues while the flow of data units 805 through the buffers of an ingress arbiter might be managed using ingress queues.

A queue 845 is a set of nodes arranged in some order by metadata describing the queue 845. The queue 845 includes a head node, or head, which is typically the next node to be processed, and a tail node, or tail, which is typically the node most recently added to the queue. A node will typically progress from the tail to the head over time as other nodes are processed and removed from the queue.

In the case of queue 845, the nodes are data unit 805, or the buffer locations(s) at which the data unit 805 begins. A data unit 805 that has been added to a queue 845 is said to be "linked" to that queue 845. A data unit 805 may belong to one or more queues 845.

In many embodiments, the sequence in which the queue 845 arranges its constituent data units 805 generally corresponds to the order in which the data units 805 or data unit portions in the queue 845 will be released and processed. Such queues 845 are known as first-in-first-out ("FIFO") queues, though in other embodiments other types of queues may be utilized. In some embodiments, the number of data units 805 or data unit portions assigned to a given queue 845 at a given time may be limited, either globally or on a per-queue basis, and this limit may change over time.

In an embodiment, queues 845 are implemented using a linking memory referred to an "inter-packet" link memory, which is separate from the associated buffer memory 844. Each entry in the link memory is said to be a node in the queue. Each link entry points comprises a data pointer, which, when the link entry is occupied, points to a memory location in the buffer memory 844 at which a corresponding data unit (or at least the start of the data unit) is found (e.g. a buffer entry, a first entry for the data unit in an intra-packet link memory, etc.). Each entry in the link memory further may further comprises a link pointer to another link entry, which corresponds to the next node in the queue. Of course, in other embodiments, other types of linking memories and/or other structures may instead be utilized instead to represent the queue.

4.9. Traffic Management

According to an embodiment, a device 800 further includes one or more traffic managers 840 configured to control the flow of data units 805 to one or more packet processor(s) 850. A traffic manager 840 may receive data units 805 directly from a port 810, from an ingress processor 850, and/or other suitable components of device 800. In an embodiment, the traffic manager 840 is configured to receive up to one TDU from each possible source (e.g. each port 810) each clock cycle of the traffic manager 840.

Traffic manager 840 may include or be coupled to buffers 844 for buffering data units 805 prior to sending those data units 805 to their respective processor(s) 850. A buffer manager within the traffic manager 840 may temporarily store data units 805 in buffers 844 as they await processing by processor(s) 850. A data unit 805 or data unit portion in a buffer 844 may eventually be "released" to one or more processor(s) 850 for processing, by reading the data unit 805 from the buffer 844 and sending the data unit 805 to the processor(s) 850. In an embodiment, traffic manager 840 may release up to a certain number of data units 805 from buffers 844 to processors 850 each clock cycle.

Beyond managing the use of buffers 844 to store data units 805 (or copies thereof), a traffic manager 840 may include queue management logic configured to assign data units 805 to queues 845 and manage the flow of data units 805 through queues 845. The traffic manager 840 may, for instance, "enqueue" a PDU that has been fully buffered by identifying a specific queue 845 to assign the PDU to, and then linking a PDU identifier or other PDU metadata to the assigned queue. The traffic manager 840 may further determine when to release—also referred to as dequeuing—data units 805 from queues 845 by sending instructions to the buffer manager 844 to read/release the data units 805 and then providing the data read from the buffer 844 to specific packet processor(s) 850.

In an embodiment, different queues 845 may exist for different sources or destinations. For example, each port 810 and/or port 890 may have its own set of queues 845. The queue 845 to which an incoming data unit 805 is assigned and linked may, for instance, be selected based on forwarding information indicating which port 890 the data unit 805 should depart from. In an embodiment, a different egress processor 850 may be associated with each different set of one or more queues 845. In an embodiment, the current processing context of the data unit 805 may be used to select which queue 845 a data unit 805 should be assigned to.

In an embodiment, there may also or instead be different queues 845 for different flows or sets of flows. That is, each identifiable traffic flow or group of traffic flows is assigned its own set of queues 845 to which its data units 805 are respectively assigned. In an embodiment, different queues 845 may correspond to different classes of traffic or quality-of-service (QoS) levels. Different queues 845 may also or instead exist for any other suitable distinguishing properties of the data units 805, such as source address, destination address, packet type, and so forth.

Though only one packet processor 850 and traffic manager 840 are depicted, a device 800 may comprise any number of packet processors 850 and traffic managers 840. For instance, different sets of ports 810 and/or ports 890 may have their own traffic manager 840 and packet processors 850. As another example, in an embodiment, the traffic manager 840 may be duplicated for some or all of the stages of processing a data unit. For example, system 800 may include a traffic manager 840 and egress packet processor 850 for an egress stage performed upon the data unit 805 exiting the system 800, and/or a traffic manager 840 and packet processor 850 for any number of intermediate stages. The data unit 805 may thus pass through any number of traffic managers 840 and/or packet processors 850 prior to exiting the system 800. In other embodiments, only a single traffic manager 840 is needed. If intermediate processing is needed, flow of a data unit 805 may loop back to the traffic manager 840 for buffering and/or queuing after each stage of intermediate processing.

In an embodiment, a traffic manager 840 is coupled to the output of an ingress packet processor(s) 850, such that data units 805 (or portions thereof) are assigned to buffers 844 only upon being initially processed by an ingress packet processor 850. Once in an egress buffer 844, a data unit 805 (or portion thereof) may be "released" to one or more egress packet processor(s) 850 for processing.

In the course of processing a data unit 805, a device 800 may replicate a data unit 805 one or more times for purposes such as, without limitation, multicasting, mirroring, debugging, and so forth. For example, a single data unit 805 may be replicated to multiple egress queues 845. For instance, a data unit 805 may be linked to separate queues 845 for each of ports 1, 3, and 8. As another example, a data unit 805 may be replicated a number of times after it reaches the head of a queue 845 (e.g. for different egress processors 850). Hence, though certain techniques described herein may refer to the original data unit 805 that was received by the device 800, it will be understood that those techniques will equally apply to copies of the data unit 805 that have been generated for various purposes. A copy of a data unit 805 may be partial or complete. Moreover, there may be an actual physical copy of the data unit 805 in buffers 844, or a single copy of the data unit 805 may be linked from a single buffer location to multiple queues 845 at the same time.

4.10. Forwarding Logic

The logic by which a device 800 determines how to handle a data unit 805—such as where and whether to send a data unit 805, whether to perform additional processing on a data unit 805, etc.—is referred to as the forwarding logic of the device 800. This forwarding logic is collectively implemented by a variety of the components of the device 800, such as described above. For example, an ingress packet processor 850 may be responsible for resolving the destination of a data unit 805 and determining the set of actions/edits to perform on the data unit 805, and an egress packet processor 850 may perform the edits. Or, the egress packet processor 850 may also determine actions and resolve a destination in some cases. Also, there may be embodiments when the ingress packet processor 850 performs edits as well.

The forwarding logic may be hard-coded and/or configurable, depending on the embodiment. For example, the forwarding logic of a device 800, or portions thereof, may, in some instances, be at least partially hard-coded into one or more ingress processors 850 and/or egress processors 850. As another example, the forwarding logic, or elements thereof, may also be configurable, in that the logic changes over time in response to analyses of state information collected from, or instructions received from, the various components of the device 800 and/or other nodes in the network in which the device 800 is located.

In an embodiment, a device 800 will typically store in its memories one or more forwarding tables (or equivalent structures) that map certain data unit attributes or characteristics to actions to be taken with respect to data units 805 having those attributes or characteristics, such as sending a data unit 805 to a selected path, or processing the data unit 805 using a specified internal component. For instance, such attributes or characteristics may include a Quality-of-Service level specified by the data unit 805 or associated with another characteristic of the data unit 805, a flow control group, an ingress port 810 through which the data unit 805 was received, a tag or label in a packet's header, a source address, a destination address, a packet type, or any other suitable distinguishing property. A traffic manager 840 may, for example, implement logic that reads such a table, determines one or more ports 890 to send a data unit 805 to based on the table, and sends the data unit 805 to an egress processor 850 that is coupled to the one or more ports 890.

According to an embodiment, the forwarding tables describe groups of one or more addresses, such as subnets of IPv4 or IPv6 addresses. Each address is an address of a network device on a network, though a network device may have more than one address. Each group is associated with a potentially different set of one or more actions to execute with respect to data units that resolve to (e.g. are directed to) an address within the group. Any suitable set of one or more actions may be associated with a group of addresses, including without limitation, forwarding a message to a specified "next hop," duplicating the message, changing the destination of the message, dropping the message, performing debugging or statistical operations, applying a quality of service policy or flow control policy, and so forth.

For illustrative purposes, these tables are described as "forwarding tables," though it will be recognized that the extent of the action(s) described by the tables may be much greater than simply where to forward the message. For example, in an embodiment, a table may be a basic forwarding table that simply specifies a next hop for each group. In other embodiments, a table may describe one or more complex policies for each group. Moreover, there may be different types of tables for different purposes. For instance, one table may be a basic forwarding table that is compared to the destination address of each packet, while another table may specify policies to apply to packets upon ingress based on their destination (or source) group, and so forth.

In an embodiment, forwarding logic may read port state data for ports 810/690. Port state data may include, for instance, flow control state information describing various traffic flows and associated traffic flow control rules or policies, link status information indicating links that are up or down, port utilization information indicating how ports are being utilized (e.g. utilization percentages, utilization states, etc.). Forwarding logic may be configured to implement the associated rules or policies associated with the flow(s) to which a given packet belongs.

As data units 805 are routed through different nodes in a network, the nodes may, on occasion, discard, fail to send, or fail to receive certain data units 805, thus resulting in the data units 805 failing to reach their intended destination. The act of discarding of a data unit 805, or failing to deliver a data unit 805, is typically referred to as "dropping" the data unit. Instances of dropping a data unit 805, referred to herein as "drops" or "packet loss," may occur for a variety of reasons, such as resource limitations, errors, or deliberate policies. Different components of a device 800 may make the decision to drop a data unit 805 for various reasons. For instance, a traffic manager 840 may determine to drop a data unit 805 because, among other reasons, buffers 844 are overutilized, a queue 845 is over a certain size, and/or a data unit 805 has a certain characteristic.

4.11. Multi-Pipeline Architecture

Figure 9:
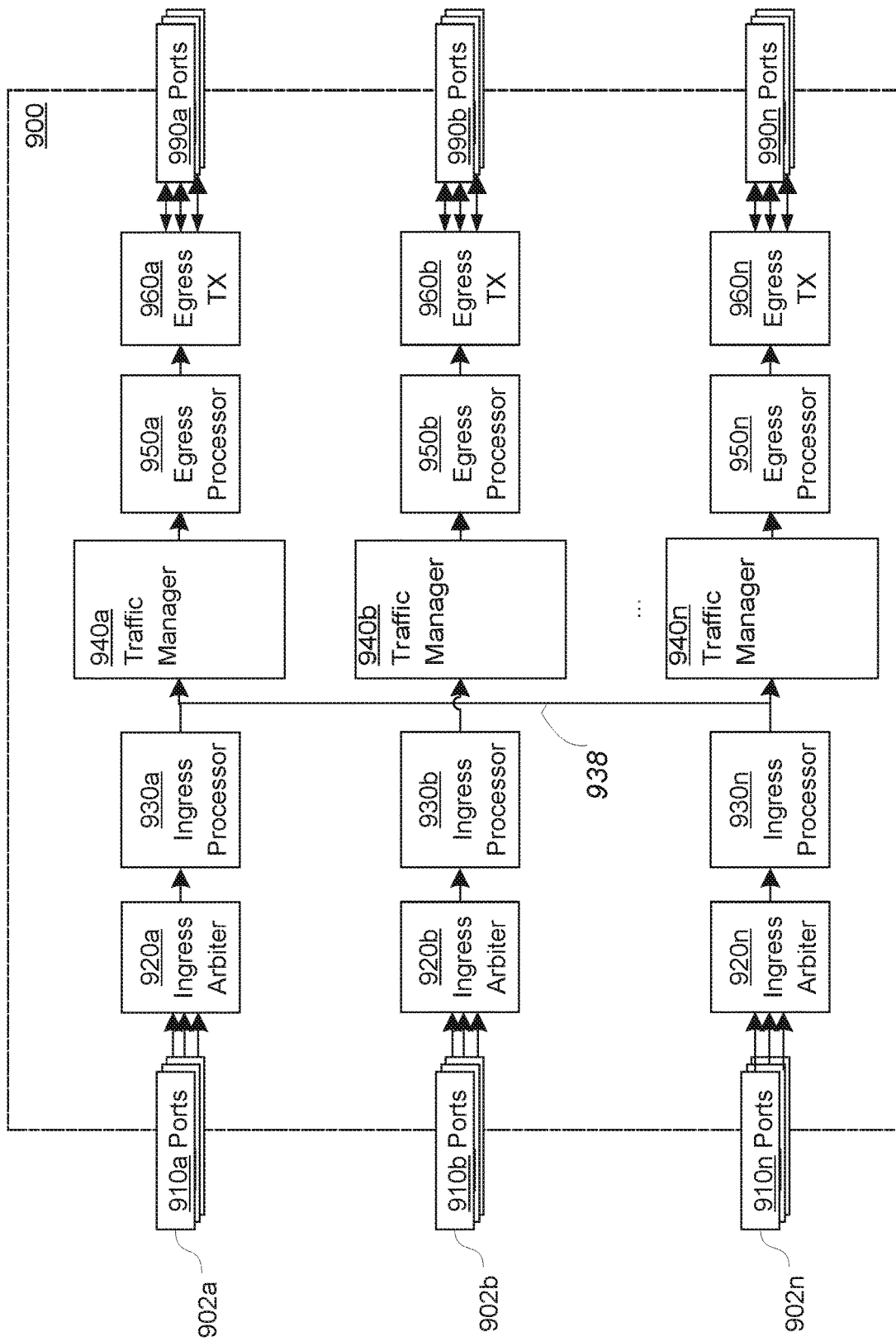
FIG. 9 illustrates an example of a network device with multiple packet processing pipelines.

In an embodiment, a network device may include multiple pipelines of data unit processing components such as those described above. FIG. 9 illustrates an example of one such network device with multiple packet processing pipelines, according to an embodiment. Network device 900 includes a plurality of ingress ports 910 and egress ports 990, similar to the ingress ports 810 and egress ports 890 of device 800. The ingress ports 910 are divided into port groups 910a-n, and each group of ports 910 feeds data units to a different pipeline 902 of processing components. There may be any number of groups of ports 910, and hence any number of corresponding pipelines 902.

Each pipeline includes an ingress arbiter 920. Each ingress arbiter 920 is coupled to a corresponding group of ingress ports 910, and receives data units from those ports 910. In some respects, each ingress arbiter 920 may be viewed as an ingress version of traffic manager 840. An ingress arbiter 920 is responsible for determining when data units are sent to downstream components, and in particular to an ingress packet processor 930 that is coupled to the ingress arbiter 920 within a corresponding pipeline 902. An ingress arbiter 920 may or may not include its own buffer memory in which it buffers data unit that await processing, depending on the embodiment.

In an embodiment, the data units sent by the ingress arbiter 920 are actually subunits, such as cells, frames, segments, or other TDUs, of larger parent data units, such as packets or other PDUs. The ingress arbiter 920 may, in an embodiment, divide a larger data unit (or ensure that the larger data unit is divided) into these subunits prior to transmitting the data units to the corresponding ingress packet processor 930. In an embodiment, a packet or other PDU may arrive at the ingress arbiter 920 as a set of TDUs. For convenience, examples are given herein where the TDU is a cell, and the PDU is a packet, but it will be appreciated that the cell may in fact be any type of subunit, and the packet may in fact be any larger data unit that comprises those subunits.

Each pipeline 902 further includes an ingress packet processor 930 to which its ingress arbiter 920 eventually sends these data units. Each ingress packet processor 930, meanwhile, functions in similar manner as an ingress packet processor 850 described above. In particular, an ingress packet processor 930 performs forwarding tasks such as resolving the data unit destination, adding or removing headers, and so forth. For instance, the ingress packet processor 930 may be responsible for generating control information that instructs downstream components of the pipelines 902 on how to handle the data unit, and this control information may either be inserted into the data unit, or be conveyed along with the data unit as sideband information.

Each pipeline 902 further includes an egress traffic manager 940, which functions in similar manner to the traffic manager 840. A common interconnect 938 is coupled to each ingress packet processor 930 on one end and each egress traffic manager 940 on the other. The interconnect 938 conveys data units to traffic manager(s) 940 indicated by the ingress packet processors 930 (e.g. based on the control information), thereby allowing data units to "switch" pipelines 902 should their destination(s) include a port 990 that is not on the same pipeline 902 as the ingress port 910 through which the data unit was received. Ingress packet processors 930 may be coupled to the interconnect 938 directly, or indirectly via other components such as a merger unit (e.g. that merges a control portion of the data unit processed by the packet processor 930 with a data portion of the data unit that bypasses the packet processor 930).

A pipeline's egress traffic manager 940 then regulates the flow of data units to the pipeline's egress packet processor 950, in similar manner as described with respect to traffic manager 840. The egress packet processor 950 processes data units in similar manner as described with respect egress packet processors 850. The egress packet processors then forward the processed data units to the pipeline's egress port transmit unit 960, which is responsible for transmission of data units out a set of one or more egress ports 990 belonging to the pipeline 902. The set of egress ports 990 for a pipeline corresponds to the pipeline's ingress ports 910.

In yet other embodiments, an egress traffic manager 940 and/or other components may be shared between such pipelines.

4.12. Ingress Buffering Subsystem Integration

As mentioned, among other uses, ingress buffering subsystems such as described above may be implemented within a switch or other network device, including the network devices 800 or 900 depicted in FIG. 8 and FIG. 9. For example, with respect to FIG. 8, an ingress subsystem 815 that implements foldable buffers and/or packed ingress interfaces may be deployed to handle input from ports 810. Ingress subsystem 815 may include, for instance, features from ingress buffering subsystem 100. The ingress buffering subsystem 815 may include a separate writer for each port 810, or groups of ports 810 may be muxed together into one or more packed interfaces using an interface like packed interface 400. TDUs that have been written to the ingress buffering subsystem 815 may then be passed to the traffic manager 840, or to one or more intermediary components.

As another example, an ingress buffering subsystem may be deployed at the front of each ingress arbiter 920 of FIG. 9. Again, the ingress buffering subsystem may include a separate writer for each port 810, or groups of ports 810 may be muxed together into one or more packed interfaces. Depending on the embodiment, TDUs that have been written to the ingress buffering subsystem may then be passed to a separate buffer for the ingress arbiter 920, or passed directly to the ingress processor 930.

In yet other embodiments, an ingress buffering subsystem as described herein may be deployed at the front of any network device component that has multiple inputs, to buffer data for TDUs as those TDUs are being received.

4.13. Miscellaneous

Devices 800 and 900 illustrate only several of many possible arrangements of components in a network device configured to provide the functionality described herein. Other arrangements may include fewer, additional, or different components, and the division of work between the components may vary depending on the arrangement. Moreover, in an embodiment, the techniques described herein may be utilized in a variety of computing contexts other than within a network 700.

For simplification, the traffic managers, packet processors, and other components are on occasion described herein as acting upon or with respect to a data unit, when in fact only a portion of the data unit may be sent to or otherwise available to the component. For instance, a packet processor may be said to process a data unit, when in fact only the data unit control portion is available to the packet processor. In such contexts, it will be understood that the information about the data unit that is actually available to the component is a representation of the data unit to that component. Any actions described herein as having been taken by the component on or with respect to the data unit may occur with respect to the representation of the data unit, and not necessarily the complete data unit.

It will be appreciated that the actual physical representation of a data unit may change as a result of the processes described herein. For instance, a data unit may be converted from a physical representation at a particular location in one memory to a signal-based representation, and back to a physical representation at a different location in a potentially different memory, as it is moved from one component to another within a network device or even between network devices. Such movement may technically involve deleting, converting, and/or copying some or all of the data unit any number of times. For simplification, however, the data unit is logically said to remain the same data unit as it moves through the device, even if the physical representation of the data unit changes. Similarly, the contents and/or structure of a data unit may change as it is processed, such as by adding or deleting header information, adjusting cell boundaries, or even modifying payload data. A modified data unit is nonetheless still said to be the same data unit, even after altering its contents and/or structure.

5.0. Example Embodiments

Examples of some embodiments are represented, without limitation, as follows:

According to an embodiment, a network apparatus comprises: a plurality of inputs configured to receive data, each input configured to receive an amount of data up to a maximum portion size each input clock cycle; a folded buffer comprising a plurality of memory banks arranged in a grid having columns and rows; a plurality of writers, each writer coupled to a different input and configured to write data unit portions received from the coupled input to the buffer, the data unit portions forming Transport Data Units ("TDUs"), the writing comprising: for any set of data unit portions that form a Transport Data Unit ("TDU") of a maximum TDU size, writing each data unit portion in the TDU to a different bank in the plurality of memory banks, at least two portions of the TDU written in each column of the grid; a reader configured to read the TDUs from the buffer and send the TDUs to one or more downstream components of the apparatus.

In an embodiment, each of the memory banks has a width equal to the maximum portion size, and each of the data unit portions is no greater in size than the maximum portion size.

In an embodiment, each writer that has a data unit portion to write in a particular memory access cycle is configured to: select a column of the grid to write the data unit portion to based on, for a TDU to which the data unit portion belongs, the number of portions of the TDU that have already been written to the buffer; identify, as blocked for the writer, any rows of the grid in which the bank at the selected column already stores another portion of the TDU; coordinate via an allocation mechanism to select a row for the writer that is not blocked for the writer and that is not being accessed in the particular memory access cycle by another writer or the reader; write the data unit portion to a memory bank of the buffer at the selected column and row of the grid.

In an embodiment, the buffer has a number of folds, wherein the number of portions in each maximum-size TDU that are written to any given column of the grid is the same as the number of folds.

In an embodiment, each of the writers is configured to write concurrently to the buffer in each of a plurality of memory access cycles, and the reader is configured to read up to a number of portions equal to the number of folds each memory access cycle of the memory access cycles.

In an embodiment, each row in the grid is accessible by only one writer or the reader in a given memory access cycle, wherein the number of rows in the buffer is equal to the number of writers, plus the number of folds, plus one.

In an embodiment, the TDUs are subunits of Protocol Data Units ("PDUs"), the apparatus further comprising: a linker configured to link the PDUs to one or more queues;

a scheduler configured to, based on the queues, instruct the reader when to read particular TDUs belonging to particular PDUs.

In an embodiment, the one or more downstream components include one or more ingress packet processors.

In an embodiment, each input comprises a different network communication interface coupled to one or more networks; wherein the TDUs are cells of packets received over the one or more networks; wherein the writers, buffer, and reader are part of an ingress arbiter configured to process the packets on ingress into the network apparatus; wherein the apparatus further comprises: one or more traffic managers configured to buffer the cells in one or more egress buffers after the cells have been read from the folded buffer, the one or more egress buffers separate from the folded buffer; one or more packet processors configured to forward the packets to destinations specified by the packets.

In an embodiment, each of the memory banks is a different single-ported Static Random-Access Memories ("SRAM").

In an embodiment, at least one input of the inputs comprises a multiplexor configured to switch between two or more ports each clock cycle, the input configured to convey data unit portions from alternating ports of the two or more ports in alternating clock cycles.

In an embodiment, at least one input of the inputs is configured to, in response to receiving both an ending part of a first PDU and a starting part of a second PDU in a single input clock cycle, delay sending the starting part of the second PDU to the writer coupled to the input, the input configured to subsequently convey multiple data unit portions of the second PDU in a single clock cycle, the writer configured to write the multiple data unit portions to different banks in the same row of the grid in a single memory access cycle.

According to an embodiment, a method comprises: receiving data at a plurality of inputs of a network apparatus, each input receiving up to a maximum portion size of the data each input clock cycle of a plurality of input clock cycles; sending data unit portions of the data to writers coupled to the inputs, the data unit portions forming Transport Data Units ("TDUs"); the writers writing the data unit portions to a folded buffer, the folded buffer comprising a plurality of memory banks arranged in a grid having columns and rows, the writing comprising: for any set of data unit portions that form a Transport Data Unit ("TDU") of a maximum TDU size, writing each data unit portion in the TDU to a different bank in the plurality of memory banks, at least two portions of the TDU written in each column of the grid; reading the TDUs from the buffer; sending the TDUs to one or more downstream components of a network apparatus.

In an embodiment, the writing further comprises, for each writer that has a data unit portion to write in a particular memory access cycle: selecting a column of the grid to write the data unit portion to based on, for a TDU to which the data unit portion belongs, the number of portions of the TDU that have already been written to the buffer;

identifying, as blocked for the writer, any rows of the grid in which the bank at the selected column already stores another portion of the TDU; coordinating via an allocation mechanism to select a row for the writer that is not blocked for the writer and that is not being accessed in the particular memory access cycle by another writer or the reader; writing the data unit portion to a memory bank of the buffer at the selected column and row of the grid.

In an embodiment, the buffer has a number of folds; wherein the number of portions in each maximum-size TDU that are written to any given column of the grid is the same as the number of folds; wherein each of the writers is configured to write concurrently to the buffer in each of a plurality of memory access cycles; wherein the reader is configured to read up to a number of portions equal to the number of folds each memory access cycle of the memory access cycles.

In an embodiment, the TDUs are subunits of Protocol Data Units ("PDUs"), the method further comprising: linking the PDUs to one or more queues; based on the queues, scheduling the reader to read particular TDUs belonging to particular PDUs.

In an embodiment, each input comprises a different network communication interface coupled to one or more networks; wherein the TDUs are cells of packets received over the one or more networks; wherein the buffer is an ingress buffer configured to store packets on ingress into the network apparatus until the packets can be processed by an ingress packet processor; wherein the one or more downstream components include the ingress packet processor; wherein the method further comprises: after processing the packets by the ingress packet processor, buffering the cells in one or more egress buffers at one or more traffic managers, the one or more egress buffers being separate from the folded buffer; sending the cells from the one or more traffic managers to the one or more egress packet processors, the one or more egress packet processors implementing forwarding logic for sending the packets via the one or more networks to destinations indicated by the packets.

In an embodiment, the method further comprises, at at least one input of the inputs, switching between two or more ports each clock cycle, the input conveying data unit portions from alternating ports of the two or more ports in alternating clock cycles.

In an embodiment, the method further comprises, in response to an input receiving both an ending part of a first PDU and a starting part of a second PDU in a single input clock cycle, delaying sending the starting part of the second PDU to the writer coupled to the input, the input subsequently conveying multiple data unit portions of the second PDU in a single clock cycle, the writer writing the multiple data unit portions to different banks in the same row of the grid in a single memory access cycle.

According to an embodiment, a network apparatus comprises: a packed ingress interface comprising: a port configured to output a data stream comprising a different data stream portion each clock cycle of a plurality of clock cycles; parsing logic configured to, when the data stream portion outputted by the port comprises a boundary between a first data unit and a second data unit, divide the data stream portion into a first part comprising ending data for the first data unit and a second part comprising starting data for the second data unit; a cache configured to store data; caching logic configured to, when the data stream portion outputted by the port comprises the boundary, store the second part in the cache; transmission logic configured to transmit data unit portions from the packed ingress interface based on data stream portions outputted by the port, including transmitting a data unit portion comprising the first part but not the second part when the data stream portion outputted by the port comprises the boundary, the second part transmitted in a subsequent data unit portion in a clock cycle subsequent to transmitting the first part; a writer configured to write the data unit portions transmitted by the packed ingress interface to different entries in a buffer.

In an embodiment, the transmission logic is further configured to, when the port outputs a given data stream portion comprising data for only a given data unit while the cache does not store data for the given data unit, transmit the given data stream portion as a given data unit portion.

In an embodiment, the transmission logic is further configured to, when the port outputs a given data stream portion comprising data for only a given data unit while the cache stores data for the given data unit, merge a first part of the given data stream portion with the cached data to form a merged data unit portion for the transmission logic to transmit.

In an embodiment, the caching logic is further configured to place a remainder of the given data stream portion in the cache.

In an embodiment, the transmission logic is further configured to, when the port outputs a given data stream portion comprising data for a given data unit that ends in the given data stream portion while the cache stores data for the given data unit, merge a first part of the given data stream portion with the cached data to form a merged data unit portion for transmitting to the buffering subsystem, and transmit a remainder of the given data unit as a second data unit portion in the same clock cycle as transmitting the merged data unit portion.

In an embodiment, the parsing logic is configured to detect boundaries between data units based on interpacket gaps and/or preambles.

In an embodiment, the data stream is a stream of packets, including the first data unit and the second data unit, wherein the port is configured to receive the packets via one or more networks coupled to the port, wherein the network apparatus is a network switch and further comprises switching logic configured to forward the packets to destinations indicated by the packets, the buffer configured to buffer the packets until the packets can be processed by a packet processor.

In an embodiment, the apparatus further comprises a plurality of packed ingress interfaces, including the packed ingress interface, each comprising at least one different port, and each coupled to a different writer into the buffer.

In an embodiment, the packed ingress interface further comprises: a plurality of ports configured to output data streams, including the port; a multiplexor coupled to the ports and configured to select between the data streams outputted by the ports in different clock cycles, wherein the plurality of clock cycles in which the port outputs data stream portions are those clock cycles in which the multiplexor selects the data stream of the port; a plurality of caches, including the cache, each cache corresponding to a different port of the ports, and configured to temporarily store leftover parts of data stream portions sent over the corresponding port until those parts can be sent in a next clock cycle in which the multiplexor selects the port.

In an embodiment, the apparatus further comprising a plurality of packed ingress interfaces, including the packed ingress interface, each comprising a different plurality of ports, and each coupled to a different writer into the buffer, the buffer comprising a plurality of memory banks organized in a grid, the grid including at least one row for each different writer.

According to an embodiment, a method comprises: each clock cycle of a plurality of clock cycles, outputting, from a port, a different data stream portion of a data stream; transmitting data unit portions to a buffering subsystem based on data stream portions outputted by the port; when the data stream portion outputted by the port comprises a boundary between a first data unit and a second data unit: dividing the data stream portion into a first part comprising ending data for the first data unit and a second part comprising starting data for the second data unit; storing the second part in a cache; transmitting a data unit portion comprising the first part but not the second part to the buffering subsystem, the second part transmitted in a subsequent data unit portion in a clock cycle subsequent to transmitting the first part; writing the data unit portions to different entries in a buffer in the buffering subsystem.

In an embodiment, the method further comprises: when the port outputs a given data stream portion comprising data for only a given data unit while the cache does not store data for the given data unit, transmitting the given data stream portion to the buffering subsystem as a given data unit portion; and when the port outputs a given data stream portion comprising data for only a given data unit while the cache stores data for the given data unit, merge a first part of the given data stream portion with the cached data to form a merged data unit portion for transmitting to the buffering subsystem.

In an embodiment, the method further comprises, when the port outputs a given data stream portion comprising data for only a given data unit while the cache stores data for the given data unit, merge a first part of the given data stream portion with the cached data to form a merged data unit portion for transmitting to the buffering subsystem; and placing a remainder of the given data stream portion in the cache.

In an embodiment, the method further comprises, when the port outputs a given data stream portion comprising data for a given data unit that ends in the given data stream portion while the cache stores data for the given data unit, merge a first part of the given data stream portion with the cached data to form a merged data unit portion for transmitting to the buffering subsystem, and transmitting a remainder of the given data unit as a second data unit portion in the same clock cycle as transmitting the merged data unit portion.

In an embodiment, the data stream is a stream of packets, including the first data unit and the second data unit, the port receiving the packets via one or more networks coupled to the port, the method comprising, after buffering the packets in the buffer, forwarding the packets to destinations indicated by the packets.

In an embodiment, the method further comprises selecting between data streams outputted by a plurality of ports, including the port, in different clock cycles, wherein the plurality of clock cycles in which the port outputs the data stream portions are those clock cycles in which the data stream of the port is selected.

According to an embodiment, a network apparatus comprises: a plurality of packed ingress interfaces, each packed ingress interface of the packed ingress interfaces including: a plurality of ports configured to received data streams via one or more networks coupled to the ports, and to output the data streams; a multiplexor coupled to the ports and configured to select between the data streams outputted by the ports in different clock cycles; a plurality of writers, each writer of the writers coupled to a different one of the packed ingress interfaces, and configured to write data unit portions outputted by the packed ingress interface to which the writer is coupled to an ingress buffer; said ingress buffer, comprising a plurality of memory banks organized in a grid, the grid including at least one row for each writer of the writers.

Yet other example embodiments are described in other sections herein.

6.0. Implementation Mechanism—Hardware Overview

According to one embodiment, the techniques described herein are implemented by one or more special-purpose computing devices. The special-purpose computing devices may be desktop computer systems, portable computer systems, handheld devices, networking devices, or any other device that incorporates hard-wired and/or program logic to implement the techniques. The special-purpose computing devices may be hard-wired to perform the techniques, or may include digital electronic devices such as one or more application-specific integrated circuits (ASICs) or field programmable gate arrays (FPGAs) that are persistently programmed to perform the techniques. Such special-purpose computing devices may also combine custom hard-wired logic, ASICs, FPGAs, or other circuitry with custom programming to accomplish the techniques.

Though certain foregoing techniques are described with respect to a hardware implementation, which provides a number of advantages in certain embodiments, it will also be recognized that, in other embodiments, the foregoing techniques may still provide certain advantages when performed partially or wholly in software. Accordingly, in such an embodiment, a suitable implementing apparatus comprises a general-purpose hardware processor and is configured to perform any of the foregoing methods by executing program instructions in firmware, memory, other storage, or a combination thereof.

Figure 10:
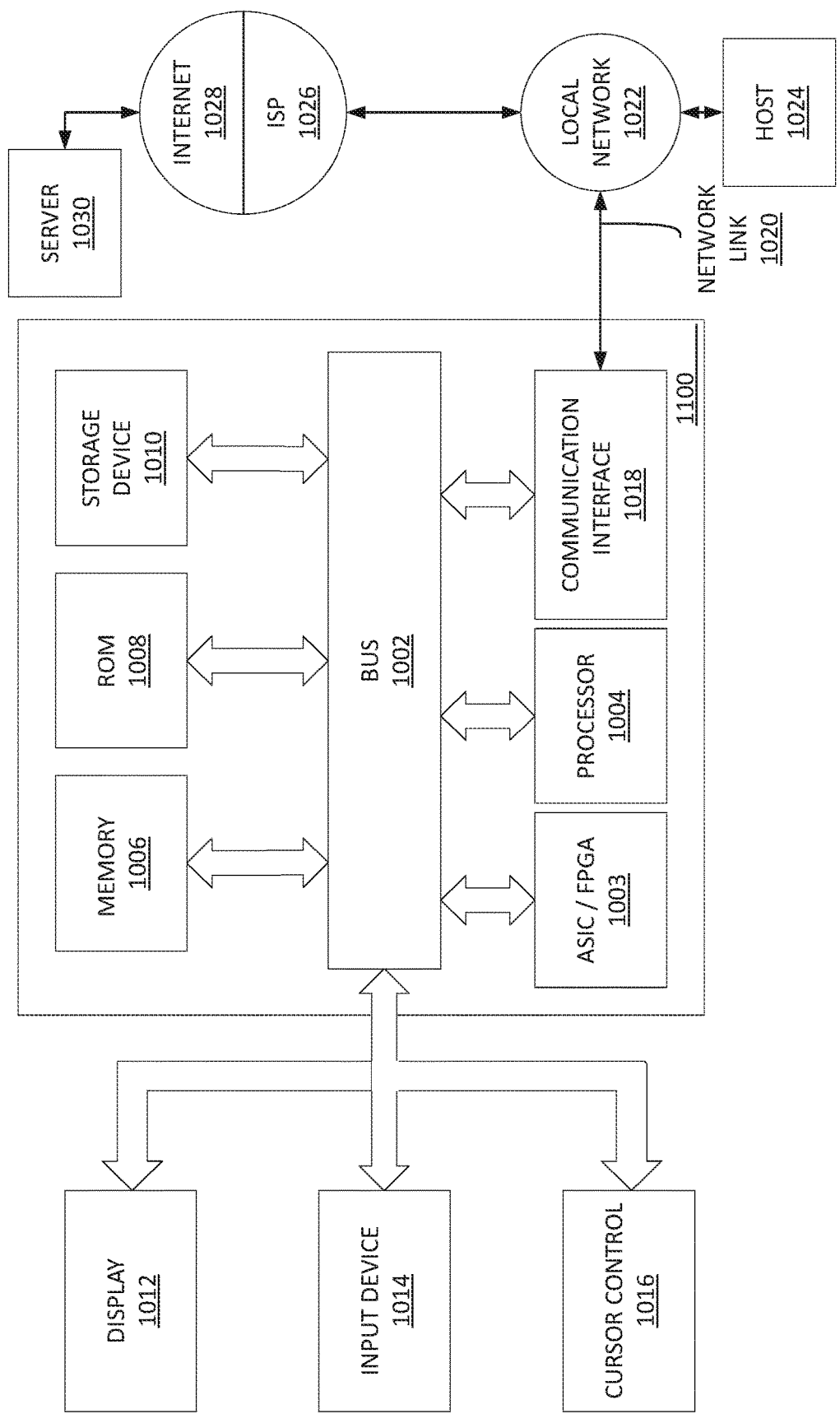
FIG. 10 is a block diagram that illustrates an example computer system that may be utilized in implementing the above-described techniques.

FIG. 10 is a block diagram that illustrates an example computer system 1000 that may be utilized in implementing the above-described techniques, according to an embodiment. Computer system 1000 may be, for example, a desktop computing device, laptop computing device, tablet, smartphone, server appliance, computing mainframe, multimedia device, handheld device, networking apparatus, or any other suitable device. In an embodiment, FIG. 10 constitutes a different view of the devices and systems described in previous sections.

Computer system 1000 may include one or more ASICs, FPGAs, or other specialized circuitry 1003 for implementing program logic as described herein. For example, circuitry 1003 may include fixed and/or configurable hardware logic blocks for implementing some or all of the described techniques, input/output (I/O) blocks, hardware registers or other embedded memory resources such as random-access memory (RAM) for storing various data, and so forth. The logic blocks may include, for example, arrangements of logic gates, flip-flops, multiplexers, and so forth, configured to generate an output signals based on logic operations performed on input signals.

Additionally, and/or instead, computer system 1000 may include one or more hardware processors 1004 configured to execute software-based instructions. Computer system 1000 may also include one or more busses 1002 or other communication mechanism for communicating information. Busses 1002 may include various internal and/or external components, including, without limitation, internal processor or memory busses, a Serial ATA bus, a PCI Express bus, a Universal Serial Bus, a HyperTransport bus, an InfiniBand bus, and/or any other suitable wired or wireless communication channel.

Computer system 1000 also includes one or more memories 1006, such as a RAM, hardware registers, or other dynamic or volatile storage device for storing data units to be processed by the one or more ASICs, FPGAs, or other specialized circuitry 1003. Memory 1006 may also or instead be used for storing information and instructions to be executed by processor 1004. Memory 1006 may be directly connected or embedded within circuitry 1003 or a processor 1004. Or, memory 1006 may be coupled to and accessed via bus 1002. Memory 1006 also may be used for storing temporary variables, data units describing rules or policies, or other intermediate information during execution of program logic or instructions.

Computer system 1000 further includes one or more read only memories (ROM) 1008 or other static storage devices coupled to bus 1002 for storing static information and instructions for processor 1004. One or more storage devices 1010, such as a solid-state drive (SSD), magnetic disk, optical disk, or other suitable non-volatile storage device, may optionally be provided and coupled to bus 1002 for storing information and instructions.

A computer system 1000 may also include, in an embodiment, one or more communication interfaces 1018 coupled to bus 1002. A communication interface 1018 provides a data communication coupling, typically two-way, to a network link 1020 that is connected to a local network 1022. For example, a communication interface 1018 may be an integrated services digital network (ISDN) card, cable modem, satellite modem, or a modem to provide a data communication connection to a corresponding type of telephone line. As another example, the one or more communication interfaces 1018 may include a local area network (LAN) card to provide a data communication connection to a compatible LAN. As yet another example, the one or more communication interfaces 1018 may include a wireless network interface controller, such as an 1002.11-based controller, Bluetooth controller, Long Term Evolution (LTE) modem, and/or other types of wireless interfaces. In any such implementation, communication interface 1018 sends and receives electrical, electromagnetic, or optical signals that carry digital data streams representing various types of information.

Network link 1020 typically provides data communication through one or more networks to other data devices. For example, network link 1020 may provide a connection through local network 1022 to a host computer 1024 or to data equipment operated by a Service Provider 1026. Service Provider 1026, which may for example be an Internet Service Provider (ISP), in turn provides data communication services through a wide area network, such as the world-wide packet data communication network now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are example forms of transmission media.

In an embodiment, computer system 1000 may send and receive data units through the network(s), network link 1020, and communication interface 1018. In some embodiments, this data may be data units that the computer system 1000 has been asked to process and, if necessary, redirect to other computer systems via a suitable network link 1020. In other embodiments, this data may be instructions for implementing various processes related to the described techniques. For instance, in the Internet example, a server 1030 might transmit a requested code for an application program through Internet 1028, ISP 1026, local network 1022 and communication interface 1018. The received code may be executed by processor 1004 as it is received, and/or stored in storage device 1010, or other non-volatile storage for later execution. As another example, information received via a network link 1020 may be interpreted and/or processed by a software component of the computer system 1000, such as a web browser, application, or server, which in turn issues instructions based thereon to a processor 1004, possibly via an operating system and/or other intermediate layers of software components.

Computer system 1000 may optionally be coupled via bus 1002 to one or more displays 1012 for presenting information to a computer user. For instance, computer system 1000 may be connected via a High-Definition Multimedia Interface (HDMI) cable or other suitable cabling to a Liquid Crystal Display (LCD) monitor, and/or via a wireless connection such as peer-to-peer Wi-Fi Direct connection to a Light-Emitting Diode (LED) television. Other examples of suitable types of displays 1012 may include, without limitation, plasma display devices, projectors, cathode ray tube (CRT) monitors, electronic paper, virtual reality headsets, braille terminal, and/or any other suitable device for outputting information to a computer user. In an embodiment, any suitable type of output device, such as, for instance, an audio speaker or printer, may be utilized instead of a display 1012.

One or more input devices 1014 are optionally coupled to bus 1002 for communicating information and command selections to processor 1004. One example of an input device 1014 is a keyboard, including alphanumeric and other keys. Another type of user input device 1014 is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane. Yet other examples of suitable input devices 1014 include a touch-screen panel affixed to a display 1012, cameras, microphones, accelerometers, motion detectors, and/or other sensors. In an embodiment, a network-based input device 1014 may be utilized. In such an embodiment, user input and/or other information or commands may be relayed via routers and/or switches on a Local Area Network (LAN) or other suitable shared network, or via a peer-to-peer network, from the input device 1014 to a network link 1020 on the computer system 1000.

As discussed, computer system 1000 may implement techniques described herein using customized hard-wired logic, one or more ASICs or FPGAs 1003, firmware and/or program logic, which in combination with the computer system causes or programs computer system 1000 to be a special-purpose machine. According to one embodiment, however, the techniques herein are performed by computer system 1000 in response to processor 1004 executing one or more sequences of one or more instructions contained in main memory 1006. Such instructions may be read into main memory 1006 from another storage medium, such as storage device 1010. Execution of the sequences of instructions contained in main memory 1006 causes processor 1004 to perform the process steps described herein.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 1010. Volatile media includes dynamic memory, such as main memory 1006. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1002. Transmission media may also take the form of acoustic or light waves, such as those generated during radio-wave and infra-red data communications.

Various forms of media may be involved in carrying one or more sequences of one or more instructions to processor 1004 for execution. For example, the instructions may initially be carried on a magnetic disk or solid-state drive of a remote computer. The remote computer can load the instructions into its dynamic memory and use a modem to send the instructions over a network, such as a cable network or cellular network, as modulated signals. A modem local to computer system 1000 may receive the data on the network and demodulate the signal to decode the transmitted instructions. Appropriate circuitry may then place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

7.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the inventive subject matter have been described with reference to numerous specific details that may vary from implementation to implementation. Thus, the sole and exclusive indicator of what is the inventive subject matter, and is intended to be the inventive subject matter, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A network apparatus comprising:
a plurality of inputs configured to receive data, each input configured to receive an amount of data up to a maximum portion size each input clock cycle;
a folded buffer comprising a plurality of memory banks arranged in a grid having columns and rows, the buffer has a number of folds;
a plurality of writers, each writer coupled to a different input and configured to concurrently write data unit portions received from the coupled input to the buffer in each of a plurality of memory access cycles, the data unit portions forming Transport Data Units ("TDUs"), the writing comprising:
for any set of data unit portions that form a Transport Data Unit ("TDU") of a maximum TDU size, writing each data unit portion in the TDU to a different bank in the plurality of memory banks, at least two portions of the TDU written in each column of the grid, the number of portions in each maximum-size TDU that are written to any given column of the grid is the same as the number of folds;
a reader configured to read up to a number of portions of the TDUs equal to the number of folds each memory access cycle of the memory access cycles from the buffer and send the TDUs to one or more downstream components of the apparatus.

2. The network apparatus of claim 1, wherein each of the memory banks has a width equal to the maximum portion size, and each of the data unit portions is no greater in size than the maximum portion size.

3. The network apparatus of claim 1, wherein each writer that has a data unit portion to write in a particular memory access cycle is configured to:
select a column of the grid to write the data unit portion to based on, for a TDU to which the data unit portion belongs, the number of portions of the TDU that have already been written to the buffer;
identify, as blocked for the writer, any rows of the grid in which the bank at the selected column already stores another portion of the TDU;
coordinate via an allocation mechanism to select a row for the writer that is not blocked for the writer and that is not being accessed in the particular memory access cycle by another writer or the reader;
write the data unit portion to a memory bank of the buffer at the selected column and row of the grid.

4. The network apparatus of claim 1, wherein each row in the grid is accessible by only one writer or the reader in a given memory access cycle, wherein the number of rows in the buffer is equal to the number of writers, plus the number of folds, plus one.

5. The network apparatus of claim 1, wherein the TDUs are subunits of Protocol Data Units ("PDUs"), the apparatus further comprising:
a linker configured to link the PDUs to one or more queues;
a scheduler configured to, based on the queues, instruct the reader when to read particular TDUs belonging to particular PDUs.

6. The network apparatus of claim 1, wherein the one or more downstream components include one or more ingress packet processors.

7. The network apparatus of claim 1,
wherein each input comprises a different network communication interface coupled to one or more networks;
wherein the TDUs are cells of packets received over the one or more networks;
wherein the writers, buffer, and reader are part of an ingress arbiter configured to process the packets on ingress into the network apparatus;
wherein the apparatus further comprises:
one or more traffic managers configured to buffer the cells in one or more egress buffers after the cells have been read from the folded buffer, the one or more egress buffers separate from the folded buffer;
one or more packet processors configured to forward the packets to destinations specified by the packets.

8. The network apparatus of claim 1, wherein each of the memory banks is a different single-ported Static Random-Access Memories ("SRAM").

9. The network apparatus of claim 1, wherein at least one input of the inputs comprises a multiplexor configured to switch between two or more ports each clock cycle, the input configured to convey data unit portions from alternating ports of the two or more ports in alternating clock cycles.

10. The network apparatus of claim 1, wherein at least one input of the inputs is configured to, in response to receiving both an ending part of a first PDU and a starting part of a second PDU in a single input clock cycle, delay sending the starting part of the second PDU to the writer coupled to the input, the input configured to subsequently convey multiple data unit portions of the second PDU in a single clock cycle, the writer configured to write the multiple data unit portions to different banks in the same row of the grid in a single memory access cycle.

11. A method comprising:
receiving data at a plurality of inputs of a network apparatus, each input receiving up to a maximum portion size of the data each input clock cycle of a plurality of input clock cycles;
sending data unit portions of the data to writers coupled to the inputs, the data unit portions forming Transport Data Units ("TDUs");
the writers concurrently writing in each of a plurality of memory access cycles the data unit portions to a folded buffer having a number of folds, the folded buffer comprising a plurality of memory banks arranged in a grid having columns and rows, the writing comprising:
for any set of data unit portions that form a Transport Data Unit ("TDU") of a maximum TDU size, writing each data unit portion in the TDU to a different bank in the plurality of memory banks, at least two portions of the TDU written in each column of the grid, the number of portions in each maximum-size TDU that are written to any given column of the grid is the same as the number of folds;
reading the TDUs from the buffer up to a number of portions equal to the number of folds each memory access cycle of the memory access cycles;
sending the TDUs to one or more downstream components of a network apparatus.

12. The method of claim 11, wherein the writing further comprises, for each writer that has a data unit portion to write in a particular memory access cycle:
selecting a column of the grid to write the data unit portion to based on, for a TDU to which the data unit portion belongs, the number of portions of the TDU that have already been written to the buffer;

identifying, as blocked for the writer, any rows of the grid in which the bank at the selected column already stores another portion of the TDU;

coordinating via an allocation mechanism to select a row for the writer that is not blocked for the writer and that is not being accessed in the particular memory access cycle by another writer or the reader;

writing the data unit portion to a memory bank of the buffer at the selected column and row of the grid.

13. The method of claim 11, wherein the TDUs are subunits of Protocol Data Units ("PDUs"), the method further comprising:

linking the PDUs to one or more queues;

based on the queues, scheduling the reader to read particular TDUs belonging to particular PDUs.

14. The method of claim 11, further comprising:

wherein each input comprises a different network communication interface coupled to one or more networks;

wherein the TDUs are cells of packets received over the one or more networks;

wherein the buffer is an ingress buffer configured to store packets on ingress into the network apparatus until the packets can be processed by an ingress packet processor;

wherein the one or more downstream components include the ingress packet processor;

after processing the packets by the ingress packet processor, buffering the cells in one or more egress buffers at one or more traffic managers, the one or more egress buffers being separate from the folded buffer;

sending the cells from the one or more traffic managers to the one or more egress packet processors, the one or more egress packet processors implementing forwarding logic for sending the packets via the one or more networks to destinations indicated by the packets.

15. The method of claim 11, further comprising, at least one input of the inputs, switching between two or more ports each clock cycle, the input conveying data unit portions from alternating ports of the two or more ports in alternating clock cycles.

16. The method of claim 11, further comprising, in response to an input receiving both an ending part of a first PDU and a starting part of a second PDU in a single input clock cycle, delaying sending the starting part of the second PDU to the writer coupled to the input, the input subsequently conveying multiple data unit portions of the second PDU in a single clock cycle, the writer writing the multiple data unit portions to different banks in the same row of the grid in a single memory access cycle.

17. One or more non-transitory computer-readable media storing instructions that, when executed by one or more computing devices, cause performance of:

receiving data at a plurality of inputs of a network apparatus, each input receiving up to a maximum portion size of the data each input clock cycle of a plurality of input clock cycles;

sending data unit portions of the data to writers coupled to the inputs, the data unit portions forming Transport Data Units ("TDUs");

the writers concurrently writing in each of a plurality of memory access cycles the data unit portions to a folded buffer having a number of folds, the folded buffer comprising a plurality of memory banks arranged in a grid having columns and rows, the writing comprising:

for any set of data unit portions that form a Transport Data Unit ("TDU") of a maximum TDU size, writing each data unit portion in the TDU to a different bank in the plurality of memory banks, at least two portions of the TDU written in each column of the grid, the number of portions in each maximum-size TDU that are written to any given column of the grid is the same as the number of folds;

reading the TDUs from the buffer up to a number of portions equal to the number of folds each memory access cycle of the memory access cycles;

sending the TDUs to one or more downstream components of a network apparatus.

* * * * *